United States Patent
Kato et al.

(10) Patent No.: US 6,326,216 B1
(45) Date of Patent: Dec. 4, 2001

(54) PROCESS FOR PRODUCING SEMICONDUCTOR INTEGRATED CIRCUIT DEVICE

(75) Inventors: Hisayuki Kato, Kokubunji; Hisahiko Abe, Kodaira; Shinji Nishihara, Kokubunji; Masahito Yamazaki, Hinode-machi; Keiichi Yoshizumi, Kokubunji, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 08/906,102

(22) Filed: Aug. 5, 1997

(30) Foreign Application Priority Data

Aug. 7, 1996 (JP) .................................................... 8-208657

(51) Int. Cl.$^7$ .................................................... H01L 21/00
(52) U.S. Cl. .............................. 438/3; 438/240; 257/295
(58) Field of Search ................................ 438/3, 240, 785, 438/778, 758; 257/295; 204/192.18, 192.22, 298.12, 298.13

(56) References Cited

U.S. PATENT DOCUMENTS

| | | | | |
|---|---|---|---|---|
| 3,670,211 | * | 6/1972 | Kumada et al. ...................... | 361/311 |
| 4,814,915 | * | 3/1989 | Wada et al. ........................... | 360/85 |
| 5,043,049 | * | 8/1991 | Takenaka ............................ | 204/192.15 |
| 5,132,283 | * | 7/1992 | McCune ................................. | 505/1 |
| 5,335,138 | * | 8/1994 | Sandhu et al. ........................ | 361/303 |
| 5,614,438 | * | 3/1997 | Evans, Jr. et al. .................... | 438/3 |

FOREIGN PATENT DOCUMENTS

| | | | |
|---|---|---|---|
| 363219577 | * | 9/1988 | (JP) . |
| 2-249278 | | 5/1990 | (JP) . |
| 6-272033 | | 9/1994 | (JP) . |
| 7-18427 | | 1/1995 | (JP) . |
| 7-18428 | | 1/1995 | (JP) . |
| 408269699 | * | 10/1996 | (JP) . |

OTHER PUBLICATIONS

Wolf et al., Silicon Processing for the VLSI Era : vol. 1, 1986, Lattice Press, p348–353.*

"Kyoyudentai Hakumaku Memory (Thin Ferroelectric Film Memory)" pp. 187–193, published by Kabushiki Kaisha Science Forum on Jun. 30, 1995.

* cited by examiner

*Primary Examiner*—Wael Fahmy
*Assistant Examiner*—Jeff Vockrodt
(74) *Attorney, Agent, or Firm*—Antonelli, Terry, Stout & Kraus, LLP

(57) ABSTRACT

In order to improve the dielectric constant, residual dielectric polarization, hysteresis characteristics, etc. of a high-dielectric or ferroelectric thin film for use in the formation of capacitive insulating films of capacitors of a DRAM or a ferroelectric RAM, a target having a density of at least 90% of the theoretical value is used in forming, by sputtering, a high-dielectric or ferroelectric thin film for use in the formation of capacitive insulating films of capacitors of a DRAM or a ferroelectric RAM.

55 Claims, 18 Drawing Sheets

PbZrxTi (1-X) O3

(PEROVSKITE STRUCTURE)

:Pb

:O

:Ti (Zr)

TARGET DENSITY AND ELECTRICAL PROPERTY

PROCESS FOR PRODUCING SEMICONDUCTOR INTEGRATED CIRCUIT DEVICE

BACKGROUND OF THE INVENTION

The present invention relates to a process for producing a semiconductor integrated circuit device, and particularly to a technology effectively applicable to the production of a semiconductor memory device wherein the capacitive insulating films of capacitors are formed of a high-dielectric material or a ferroelectric material.

A DRAM (dynamic random access memory) has become the mainstream of large-capacity semiconductor memory devices since it is so simple in memory cell structure as to be easily miniaturized. It is under investigation to use a high-dielectric material of at least 20 in relative dielectric constant, such as $Ta_2O_5$ or such as BST {$(Ba, Sr)TiO_3$}, or a ferroelectric material in excess of 100 in relative dielectric constant, such as PZT ($PbZr_xTi_{1-x}O_3$), PLT ($PbLa_xTi_{1-x}O_3$), PLZT, $PbTiO_3$, $SrTiO_3$, or $BaTiO_3$ in constituting a DRAM as a countermeasure for making up for a recent decrease in the amount of electric charge storable in a capacitor in keeping with the miniaturization of a memory cell.

On the other hand, in the field of nonvolatile memories, the development of a ferroelectric RAM wherein the polarization inversion of the ferroelectric material mentioned above is utilized for holding memories is in progress. The ferroelectric RAM is expected to be utilizable as a substitute for a flash memory or EEPROM since it permits frequent data rewriting and has a high rewriting speed. Moreover, the ferroelectric RAM is also expected to be utilizable as a substitute for an SRAM for the backup of a battery used in a memory card or the like since it is reduced in electric current consumption and so simple in memory cell structure as to permit high-level integration.

One method of forming a thin film of a high-dielectric or ferroelectric material is a sputtering method wherein an inert gas such as Ar (argon) is impinged against a target made of a hot-pressed sinter of a film-forming material to release clusters of the film-forming material, which are then deposited on a substrate disposed facing the target. In a sputtering method wherein use is made of a target constituted of a high-dielectric or ferroelectric material, particularly a double oxide having a perovskite crystal structure, examples of which include PZT, PLT, and PLZT, however, it is known that the formation of a thin film having a stable composition is difficult for various reasons.

For example, in Japanese Patent Laid-Open No. 249,278/1990, it is pointed out that a thin film of a ferroelectric material having a perovskite crystal structure such as PZT, when formed by sputtering, is liable to the shortage of oxygen in the thin film. A countermeasure to this as disclosed in the above patent gazette is a method wherein a thin film of a ferroelectric material is formed over a substrate by sputtering and then annealed in high-pressure oxygen to effect oxygen uptake into the film to thereby obtain a dense thin film close to the stoichiometric composition and improved in the degree of orientation.

In Japanese Patent Laid-Open No. 272,033/1994 directed to a process for producing a PZT or PLZT target, it is pointed out that an attempt to make the crystal structure of a target homogeneous and fine for the purpose of decreasing the amount of the formed particles causative of short circuit and disconnection of wirings in an LSI complicates the step of hot-pressing a starting material powder to form the target, whereby there arise the problems of contamination of oxygen, etc. Wait impurities and a lot-to-lot variation of oxygen concentration. A countermeasure to this as disclosed in the above patent gazette is the technique of forming a target using a starting material powder of a comparatively large particle size obtained by mechanical alloying.

The above patent gazette also discloses a method wherein the oxygen content of a target is decreased to a value lower than that of the stoichiometric composition to control the oxygen content of the film composition. A target produced by this method is formed into a film by sputtering in an inert gas atmosphere or an oxygen atmosphere, followed by annealing at a temperature of 400 to 700° C. if necessary.

Japanese Patent Laid-Open No. 18,427/1995 and Japanese Patent Laid-Open No. 18,428/1995 both directed to an improvement in a sputtering Pb-containing perovskite crystal target such as PZT, PLT or PLZT disclose the technique of decreasing the localized variation of the Pb content in a thin ferroelectric film, wherein a Pb-containing double oxide and extra PbO which accounts for 5 to 40 wt. % of the whole body are hot-pressed and sintered to produce a target, provided that the extra PbO is mainly constituted of PbO having a tetragonal or rhombic crystal structure.

In "KYOYUDENTAI HAKUMAKU MEMORY (THIN FERROELECTRIC FILM MEMORY)" pp. 187–193, published by Kabushiki Kaisha Science Forum on Jun. 30, 1995, it is pointed out that the formation of a thin PZT-sputtered film involves re-evaporation of Pb due to the temperature or resputtering to present the problem of failure in obtaining a thin film having a stoichiometric composition. A countermeasure to this as introduced by the above-mentioned document is multi-component sputtering equipment wherein a PZT target and a PbO target are simultaneously sputtered to compensate for re-evaporated Pb by PbO, and a method wherein a thin film having a pyrochlore structure is formed by keeping the temperature of a substrate low during sputtering and then annealed to convert that structure,into a perovskite structure.

BRIEF SUMMARY OF THE INVENTION

Although various methods of attaining an improvement have been proposed because a thin film having a stable composition can hardly be obtained by sputtering using a target made of a high-dielectric or ferroelectric material, particularly a double oxide having a perovskite crystal structure, the fact is that a sputtering method capable of providing a high-dielectric or ferroelectric thin film endowed with desired properties (e.g., dielectric constant, residual dielectric polarization, hysteresis characteristics, etc.) has not been developed yet.

An object of the present invention is to provide a technology according to which a high-dielectric or ferroelectric thin film improved in dielectric constant, residual dielectric polarization, hysteresis characteristics, etc. can be obtained.

The foregoing and other objects and novel features of the present invention will become apparent from the description of the specification taken in connection with the accompanying drawings.

The following brief description will be made of the outlines of representative embodiments of the invention disclosed in the instant application.

(1) The process for producing a semiconductor integrated circuit device according to the present invention comprises the use of a target having a density of at least 90% of the theoretical value in forming a high-dielectric thin film or a ferroelectric thin film over a substrate by sputtering.

(2) The process for producing a semiconductor integrated circuit device according to the present invention comprises:

(a) installing a target made of a high-dielectric material or a ferroelectric material and having a density of at least 90% of the theoretical value in a target retainer portion provided in the treatment chamber of sputtering equipment, and disposing a substrate in such a way that it faces the target;

(b) applying an RF bias to the substrate while introducing an inert gas into the treatment chamber reduced in pressure to a predetermined degree of vacuum; and (c) forming a plasma between the target and the substrate and impinging ions of the inert gas formed by the discharge of the plasma against the target to deposit clusters of the high-dielectric material or the ferroelectric material released from the surface of the target over the substrate to thereby form a high-dielectric thin film or a ferroelectric thin film over the substrate.

(3) The process for producing a semiconductor integrated circuit device according to the present invention comprises:

(a) depositing a first conducting film over a principal plane of a wafer for use in the production of a semiconductor integrated circuit device;

(b) depositing a high-dielectric thin film or a ferroelectric thin film over the wafer having the first conducting film deposited thereover by sputtering using a target having a density of at least 90% of the theoretical value;

(c) depositing a second conducting film over the wafer having the high-dielectric thin film or the ferroelectric thin film deposited thereover; and (d) sequentially etching the second conducting film, the high-dielectric thin film or the ferroelectric thin film, and the first conducting film by using a photoresist as a mask to form capacitors.

Some other embodiments of the present invention involved in the instant application will be exemplified in the following itemized form:

1. The process for producing a semiconductor integrated circuit device, wherein a target having a density of at least 90% of the theoretical value is used in forming a high-dielectric thin film or a ferroelectric thin film over a substrate by sputtering.

2. The process for producing a semiconductor integrated circuit device as set forth in the above item 1, wherein the relative dielectric constant of the high-dielectric thin film is at least 20.

3. The process for producing a semiconductor integrated circuit device as set forth in the above item 1, wherein the relative dielectric constant of the ferroelectric thin film is at least 100.

4. The process for producing a semiconductor integrated circuit device as set forth in the above item 1, wherein the ferroelectric thin film substantially has a perovskite crystal structure.

5. The process for producing a semiconductor integrated circuit device as set forth in the above item 1, wherein the ferroelectric thin film is electrically capable of polarization inversion.

6. The process for producing a semiconductor integrated circuit device, comprising:

(a) installing a target made of a high-dielectric material or a ferroelectric material and having a density of at least 90% of the theoretical value in a target holding means provided in the treatment chamber of sputtering equipment, and disposing a substrate in such a way that it faces the target;

(b) applying an RF bias to the substrate while introducing an inert gas into the treatment chamber reduced in pressure to a predetermined degree of vacuum; and (c) forming a plasma between the target and the substrate and impinging ions of the inert gas formed by the discharge of the plasma against the target to deposit clusters of the high-dielectric material or the ferroelectric material released from the surface of the target over the substrate to thereby form a high-dielectric thin film or a ferroelectric thin film over the substrate.

7. The process for producing a semiconductor integrated circuit device as set forth in the above item 6, wherein the ferroelectric thin film substantially has a perovskite crystal structure.

8. The process for producing a semiconductor integrated circuit device, comprising:

(a) depositing a first conducting film over a principal plane of a wafer for use in the production of a semiconductor integrated circuit device;

(b) depositing a high-dielectric thin film or a ferroelectric thin film over the wafer having the first conducting film deposited thereover by sputtering using a target having a density of at least 90% of the theoretical value;

(c) depositing a second conducting film over the wafer having the high-dielectric thin film or the ferroelectric thin film deposited thereover; and (d) sequentially etching the second conducting film, the high-dielectric thin film or the ferroelectric thin film, and the first conducting film by using a photoresist as a mask to form capacitors.

9. The process for producing a semiconductor integrated circuit device as set forth in the above item 8, wherein the capacitors are each a capacitor of a memory cell of a DRAM.

10. The process for producing a semiconductor integrated circuit device as set forth in the above item 8, wherein the capacitors are each a capacitor of a memory cell of a ferroelectric RAM.

11. The process for producing a semiconductor integrated circuit device as set forth in the above item 10, wherein the memory cell of the ferroelectric RAM comprises one MISFET and one of the capacitors.

12. The process for producing a semiconductor integrated circuit device as set forth in the above item 8, wherein the first and second conducting films are made of one or more metals and/or metal oxides selected from the group consisting of Pt, Ir, $IrO_2$, Rh, $RhO_2$, Os, $OsO_2$, Ru, $RuO_2$, Re, $ReO_3$, Pd, and Au.

13. The process for producing a semiconductor integrated circuit device as set forth in the above item 8, wherein the ferroelectric thin film is made of a ferroelectric material having a perovskite crystal structure and selected from the group consisting of PZT, PLT, PLZT, SBT, $PbTiO_3$, $SrTiO_3$, and $BaTiO_3$.

14. The process for producing a semiconductor integrated circuit device as set forth in the above item 8, wherein the high-dielectric thin film or the ferroelectric thin film is annealed in an oxygen atmosphere after the deposition thereof.

15. The process for producing a semiconductor integrated circuit device, comprising:

(a) preparing a wafer for use in the production of a semiconductor integrated circuit device, wherein a part or the whole of each of a plurality of semiconductor elements is formed on the first principal plane side of the wafer; and (b) forming a high-dielectric thin film or a ferroelectric thin film, which is to constitute dielectric films for information storage in a volatile or nonvolatile memory, over the first principal plane of the wafer either directly or with a plurality of intermediate films therebetween by sputtering using a target having a density of as high as at least 90% of the theoretical density at least in the portion thereof subject to sputtering.

16. The process for producing a semiconductor integrated circuit device as set forth in the above item 15, wherein the dielectric film for information storage has a relative dielectric constant of at least 20 in the final product.

17. The process for producing a semiconductor integrated circuit device as set forth in the above item 16, wherein the dielectric film for information storage substantially has a perovskite structure.

18. The process for producing a semiconductor integrated circuit device, comprising:

(a) preparing a wafer for use in the production of a semiconductor integrated circuit device, wherein a part or the whole of each of a plurality of semiconductor elements is formed on the first principal plane side of the wafer;

(b) forming a conducting film, which constitutes a lower electrode of a capacitive element for information storage in a volatile or nonvolatile memory, over the first principal plane of the wafer either directly or with a plurality of intermediate films therebetween;

(c) forming a high-dielectric or ferroelectric thin film, which constitutes a film of a capacitive element for information storage in a volatile or nonvolatile memory, over the first principal plane of the wafer having the lower electrode formed thereover either directly or with a plurality of intermediate films therebetween by sputtering using a target having a density of as high as at least 90% of the theoretical density at least in the portion thereof subject to sputtering; and (d) forming a conducting film, which constitutes an upper electrode of a capacitive element for information storage in a volatile or nonvolatile memory, over the first principal plane of the wafer having the dielectric film formed thereover either directly or with a plurality of intermediate films therebetween.

19. The process for producing a semiconductor integrated circuit device as set forth in the above item 18, wherein the dielectric film for information storage has a relative dielectric constant of at least 20 in the final product.

20. The process for producing a semiconductor integrated circuit device as set forth in the above item 19, wherein the dielectric film for information storage substantially has a perovskite structure.

21. The process for producing a semiconductor integrated circuit device, comprising:

(a) preparing a wafer for use in the production of a semiconductor integrated circuit device, wherein a part or the whole of each of a plurality of semiconductor elements is formed on the first principal plane side of the wafer;

(b) leveling the first principal plane of the wafer having the plurality of semiconductor elements formed thereover by chemical mechanical polishing; and (c) forming a high-dielectric or ferroelectric film, which constitutes a dielectric film for information storage in a volatile or nonvolatile memory, over the leveled first principal plane of the wafer either directly or with a plurality of intermediate films therebetween by sputtering using a target having a density of as high as at least 90% of the theoretical density at least in the portion thereof subject to sputtering.

22. The process for producing a semiconductor integrated circuit device as set forth in the above item 21, wherein the dielectric film for information storage has a relative dielectric constant of at least 20 in the final product.

23. The process for producing a semiconductor integrated circuit device as set forth in the above item 22, wherein the dielectric film for information storage substantially has a perovskite structure.

24. The process for producing a semiconductor integrated circuit device, comprising:

(a) preparing a wafer for use in the production of a semiconductor integrated circuit device, wherein a part or the whole of each of a plurality of semiconductor elements is formed on the first principal plane side of the wafer;

(b) leveling the first principal plane of the wafer having the plurality of semiconductor elements formed thereover by chemical mechanical polishing;

(c) forming a conducting film, which constitutes a lower electrode of a capacitive element for information storage in a volatile or nonvolatile memory, over the leveled first principal plane of the wafer either directly or with a plurality of intermediate films therebetween;

(d) forming a high-dielectric or ferroelectric film, which constitutes a dielectric film of a capacitive element for information storage in a volatile or nonvolatile memory, over the first principal plane of the wafer having a layer of the lower electrode formed thereover either directly or with a plurality of intermediate films therebetween by sputtering using a target having a density of as high as at least 90% of the theoretical density at least in the portion thereof subject to sputtering; and (e) forming a conducting film, which constitutes an upper electrode of a capacitive element for information storage in a volatile or nonvolatile memory, over the first principal plane of the wafer having the dielectric film formed thereover either directly or with one or more intermediate films therebetween.

25. The process for producing a semiconductor integrated circuit device as set forth in the above item 24, wherein the dielectric film for information storage has a relative dielectric constant of at least 20 in the final product.

26. The process for producing a semiconductor integrated circuit device as set forth in the above item 25, wherein the dielectric film for information storage substantially has a perovskite structure.

DETAILED DESCRIPTION OF THE INVENTION

An embodiment of the present invention will now be described in detail with reference to the accompanying drawings. It is to be noted that, in all the figures for the explanation of the embodiments, the same symbols are attached to the parts having the same functions, thus omitting repeated explanation thereof.

Figure 1:
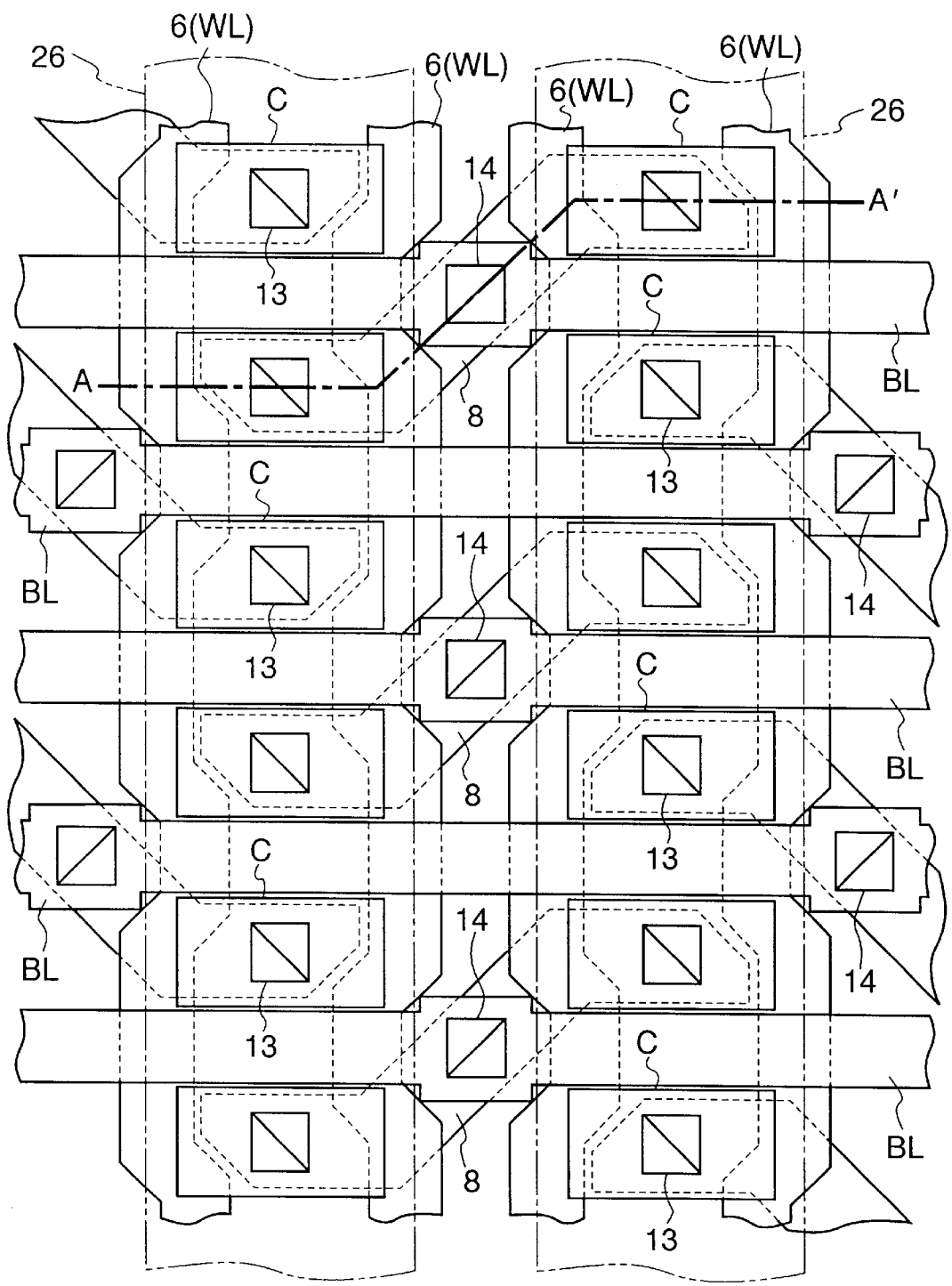
FIG. 1 is a plan view of the essential part of a semiconductor substrate, which illustrates the process for producing a semiconductor integrated circuit device according to an embodiment of the present invention.

FIG. 1 is a plan view of a layout of memory cells of a DRAM (or a ferroelectric RAM) according to this embodiment. Each of the memory cells adopts a cell with two points of intersection (folded bitline constitution) and a COB (capacitor over bitline) structure wherein a capacitor is disposed over a bitline. A transistor (memory cell selection MISFET) of each memory cell is connected via a bitline BL to peripheral circuit. The bitline BL is connected to one of n-type semiconductor regions 8 (source and drain regions) of the memory cell selection MISFET through a connecting hole 14. The operation of the memory cell selection MISFET is controlled by a wordline WL (gate electrode 6). This wordline WL (gate electrode 6) is connected to peripheral circuits. A capacitor C disposed over the bitline BL is connected to the other one of the n-type semiconductor regions 8 (source and drain regions) of the memory cell selection MISFET through a connecting hole 13. The capacitor C is connected via a plate electrode 26 to peripheral circuits.

A first feature of this planar layout is that one plate electrode 26 is disposed per two wordlines WL. This layout can diminish the capacity of the plate electrode 26 to facilitate the control of the potential of the plate electrode 26 with peripheral circuits. The number of the plate electrodes 26 may alternatively be such as to be either one per wordline WL or one per three wordlines WL. As the number of the plate electrodes 26 is increased as against the number of the wordlines WL, however, the level of integration can hardly be raised. On the other hand, as the number of the plate electrodes 26 is decreased as against the number of the wordlines WL, the capacity of each plate electrode 26 is so increased that the control thereof with peripheral circuits becomes difficult. The optimum number of the plate electrodes 26 is varied depending on the use of the DRAM (ferroelectric RAM).

A second feature of this planar layout is that the plate electrodes 26 are extended in the same direction as that of the wordlines WL (gate electrodes 6). This enables the control of the potential of each plate electrode 26 with peripheral circuits to be effected in synchronizing that potential with the potential of the wordline WL.

Figure 2:
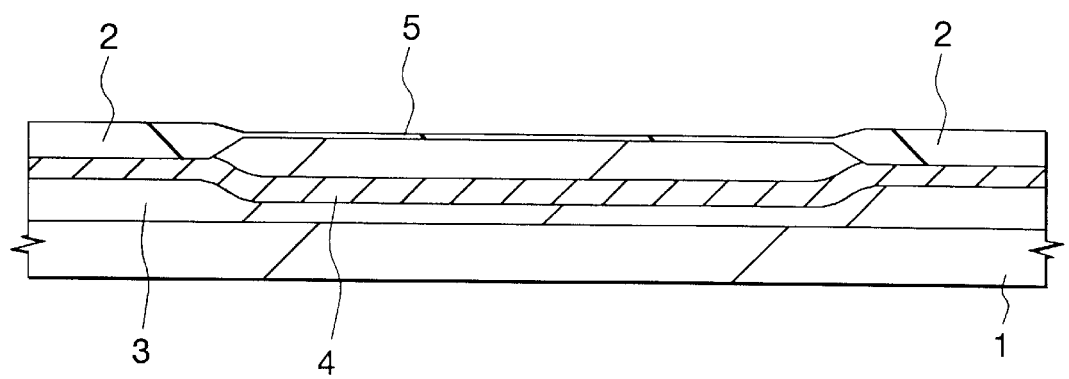
FIG. 2 is a cross-sectional view of the essential part of a semiconductor substrate, which illustrates the process for producing a semiconductor integrated circuit device according to an embodiment of the present invention.

In the production of these memory cells, a semiconductor substrate 1 made of p-type single-crystal silicon is first prepared, and a field oxide film 2 is then formed on the surface of the substrate 1 by the selective oxidation (LOCOS) method, followed by ion implantation of a p-type dopant (B) into the semiconductor substrate 1 to form a p-type well 3, as shown in FIG. 2 (cross-sectional view taken along the line A–A' of FIG. 1). Subsequently, a p-type dopant (B) is ion-implanted into the p-type well 3 to form a p-type channel stopper layer 4, and a gate oxide film 5 is then formed on the surface of the active region of the p-type well 3 surrounded by the field oxide film 2 according to a thermal oxidation method.

Figure 3:
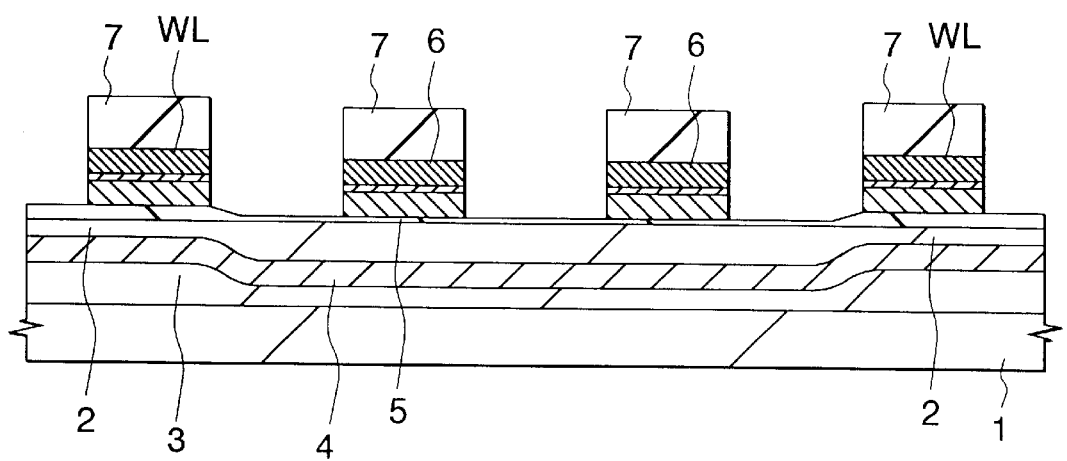
FIG. 3 is a cross-sectional view of the essential part of a semiconductor substrate, which illustrates the process for producing a semiconductor integrated circuit device according to an embodiment of the present invention.

The gate electrodes 6 (wordlines WL) of the memory cell selection MISFETs are then formed as shown in FIG. 3. The gate electrodes 6 (wordlines WL) are formed, for example, according to a procedure comprising depositing a polycrystalline silicon film over the semiconductor substrate 1 by CVD, then depositing a TiN film and a W film by sputtering, and further depositing a silicon nitride film 7 as a cap insulating film by plasma CVD, and then patterning these films by etching using a photoresist as a mask. The polycrystalline silicon film that constitutes a part of each gate electrode 6 (wordline WL) is doped with an n-type dopant (P) to lower the resistance thereof.

Figure 4:
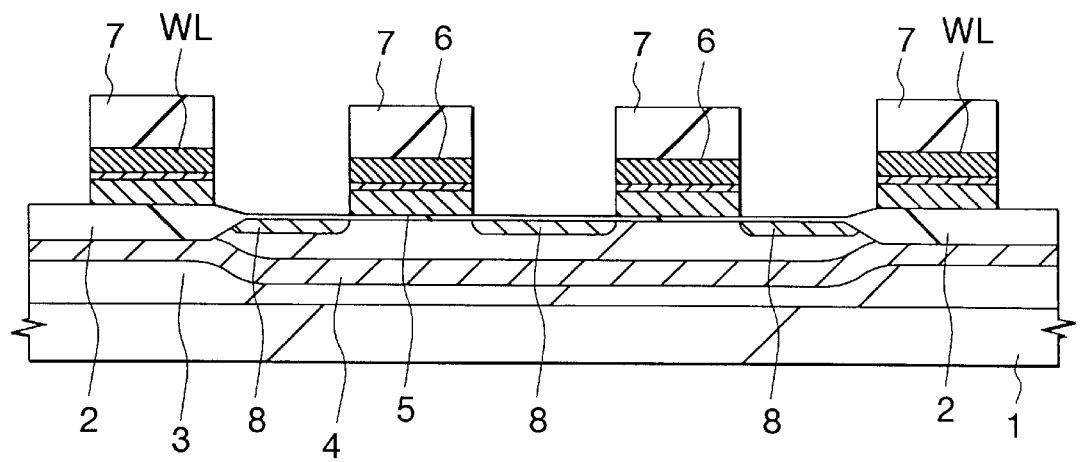
FIG. 4 is a cross-sectional view of the essential part of a semiconductor substrate, which illustrates the process for producing a semiconductor integrated circuit device according to an embodiment of the present invention.

As shown in FIG. 4, an n-type dopant (P) is then ion-implanted into the p-type well 3 to form n-type semiconductor regions 8, 8 (source and drain regions) of the memory cell selection MISFETs in the p-type well 3 on both sides of each gate electrode 6 (wordline WL).

Figure 5:
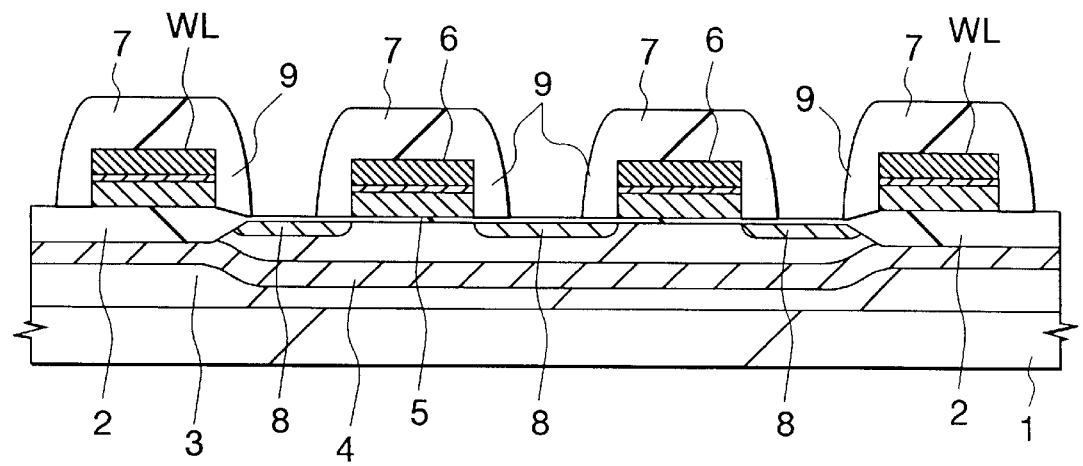
FIG. 5 is a cross-sectional view of the essential part of a semiconductor substrate, which illustrates the process for producing a semiconductor integrated circuit device according to an embodiment of the present invention.

As shown in FIG. 5, side wall spacers 9 are then formed on the side walls of the gate electrodes 6 (wordlines WL). The side wall spacers 9 are formed according to a procedure comprising depositing a silicon nitride film over the gate electrodes 6 (wordlines WL) by plasma CVD and then processing the silicon nitride film by anisotropic etching.

Figure 6:
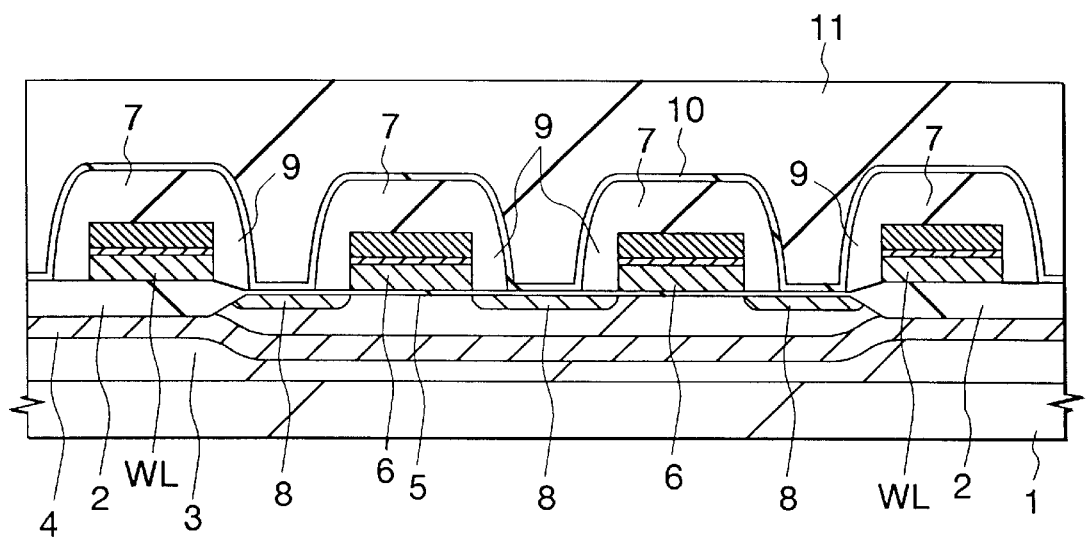
FIG. 6 is a cross-sectional view of the essential part of a semiconductor substrate, which illustrates the process for producing a semiconductor integrated circuit device according to an embodiment of the present invention.

As shown in FIG. 6, a silicon oxide film 10 and a BPSG (boron-doped phospho silicate glass) film 11 are then deposited over the memory cell selection MISFETs, and the BPSG film 11 is then polished by the chemical mechanical polishing (CMP) method to level the surface thereof.

Figure 7:
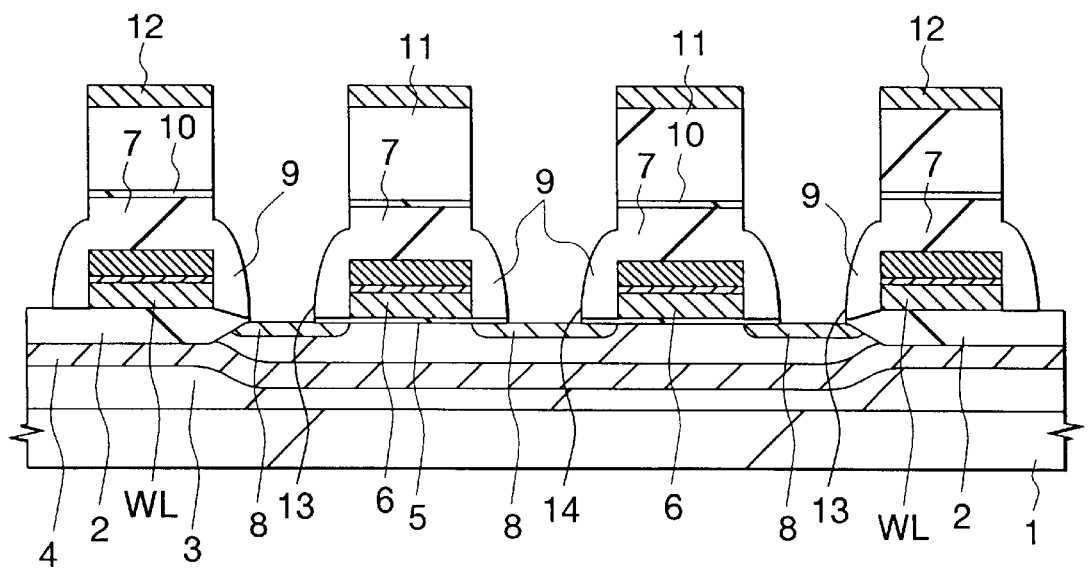
FIG. 7 is a cross-sectional view of the essential part of a semiconductor substrate, which illustrates the process for producing a semiconductor integrated circuit device according to an embodiment of the present invention.

As shown in FIG. 7, a polycrystalline silicon film 12 is then deposited over the BPSG film 11 by CVD, followed by the etching of the polycrystalline silicon film 12, the BPSG film 11, the silicon oxide film 10 and the gate oxide film 5 by using a photoresist as a mask, whereby a connecting hole 13 is formed over one (n-type semiconductor region 8) of the source and drain regions of each memory cell selection MISFET while forming a connecting hole 14 over the other one (n-type semiconductor region 8). In this etching, the silicon nitride films 7 formed over the gate electrodes 6 (wordlines WL) of the memory cell selection MISFETs and the silicon nitride side wall spacers 9 formed on the side walls thereof are only slightly etched to enable the connecting holes 13 and 14 of a minute diameter to be formed by self alignment even without providing a room for aligning the connecting holes 13, 14 with the gate electrodes 6 (wordlines WL).

Figure 8:
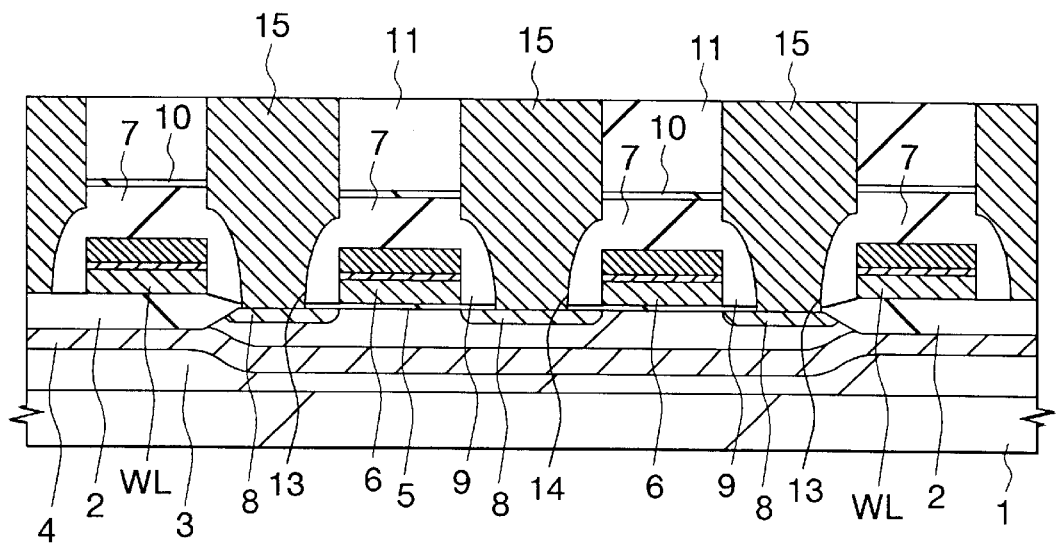
FIG. 8 is a cross-sectional view of the essential part of a semiconductor substrate, which illustrates the process for producing a semiconductor integrated circuit device according to an embodiment of the present invention.

As shown in FIG. 8, polycrystalline silicon plugs 15 are then embedded in the connecting holes 13, 14. These plugs 15 are formed according to a procedure comprising depositing a polycrystalline silicon film over polycrystalline silicon films 12 as mentioned above by CVD, and etching back this polycrystalline silicon film and the polycrystalline silicon films 12 to remove them. The polycrystalline silicon film that constitutes the plugs 15 is doped with an n-type dopant (P). The plugs 15 may alternatively be formed by embedding, for example, TiN, W, Ti or Ta instead of the polycrystalline silicon.

Figure 9:
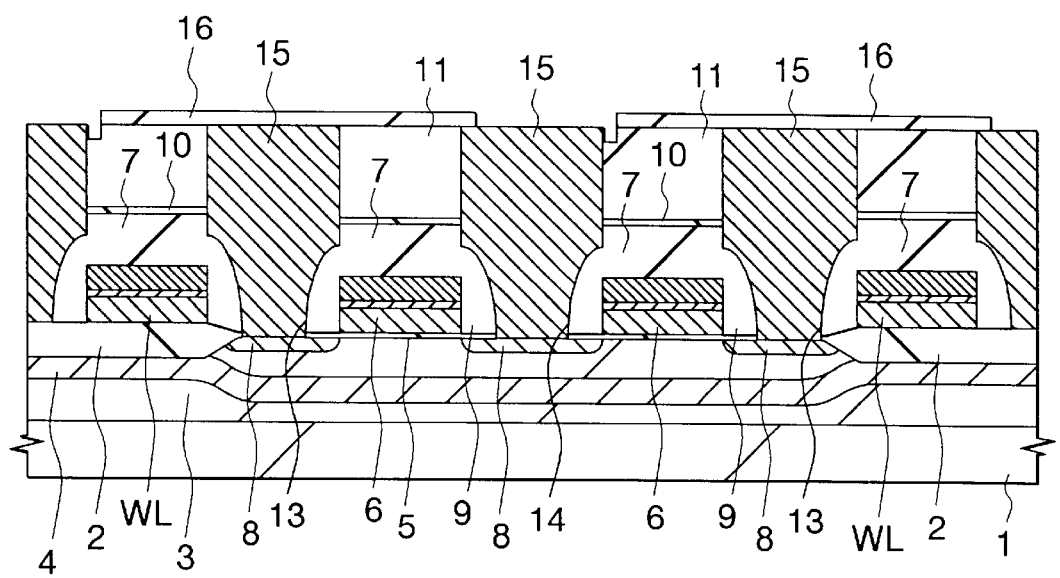
FIG. 9 is a cross-sectional view of the essential part of a semiconductor substrate, which illustrates the process for producing a semiconductor integrated circuit device according to an embodiment of the present invention.
Figure 10:
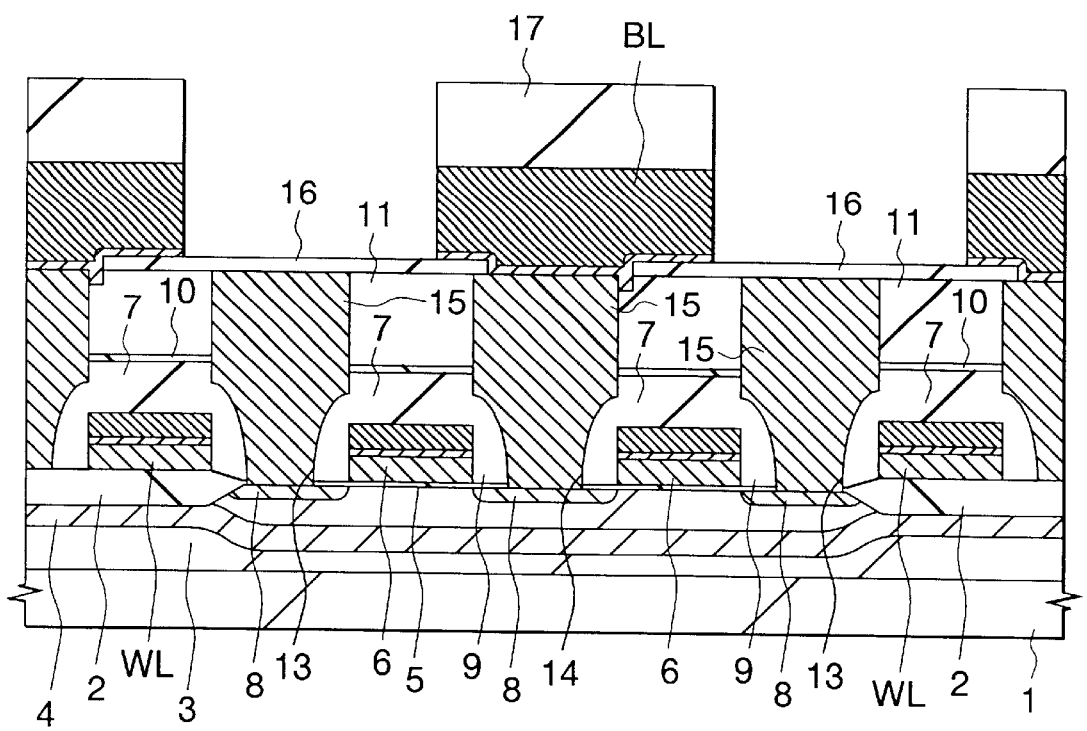
FIG. 10 is a cross-sectional view of the essential part of a semiconductor substrate, which illustrates the process for producing a semiconductor integrated circuit device according to an embodiment of the present invention.

As shown in FIG. 9, a silicon oxide film 16 is then deposited over the BPSG films 11 by CVD and then etched using a photoresist as a mask to remove the silicon oxide film 16 overlying the connecting holes 14. Thereafter, bitlines BL are formed over the connecting holes 14, as shown in FIG. 10. The bitlines BL are formed according to a procedure comprising depositing a TiN film and a W film over the silicon oxide film 16 by sputtering, further depositing a silicon nitride film 17 as a cap insulating film by plasma CVD, and then patterning these films by etching using a photoresist as a mask.

Figure 11:
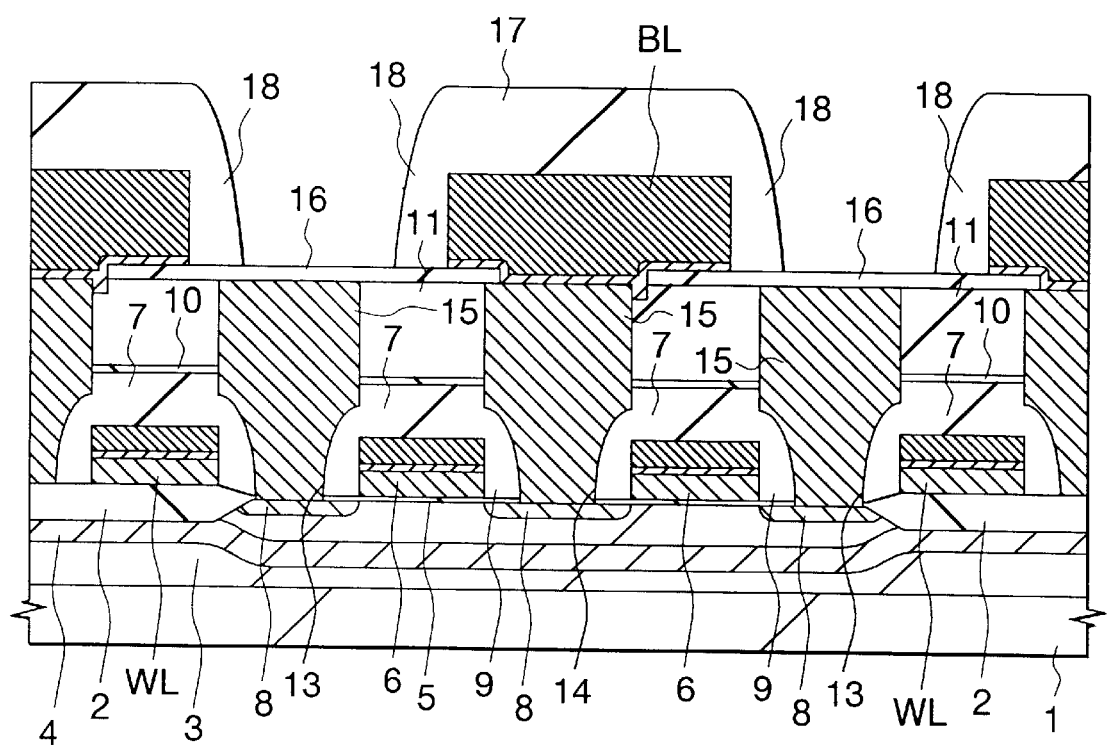
FIG. 11 is a cross-sectional view of the essential part of a semiconductor substrate, which illustrates the process for producing a semiconductor integrated circuit device according to an embodiment of the present invention.

As shown in FIG. 11, side wall spacers 18 are then formed on the side walls of the bitlines BL. The side wall spacers 18 are formed according to a procedure comprising depositing a silicon nitride film over the bitlines BL by plasma CVD and then processing it by anisotropic etching.

Figure 12:
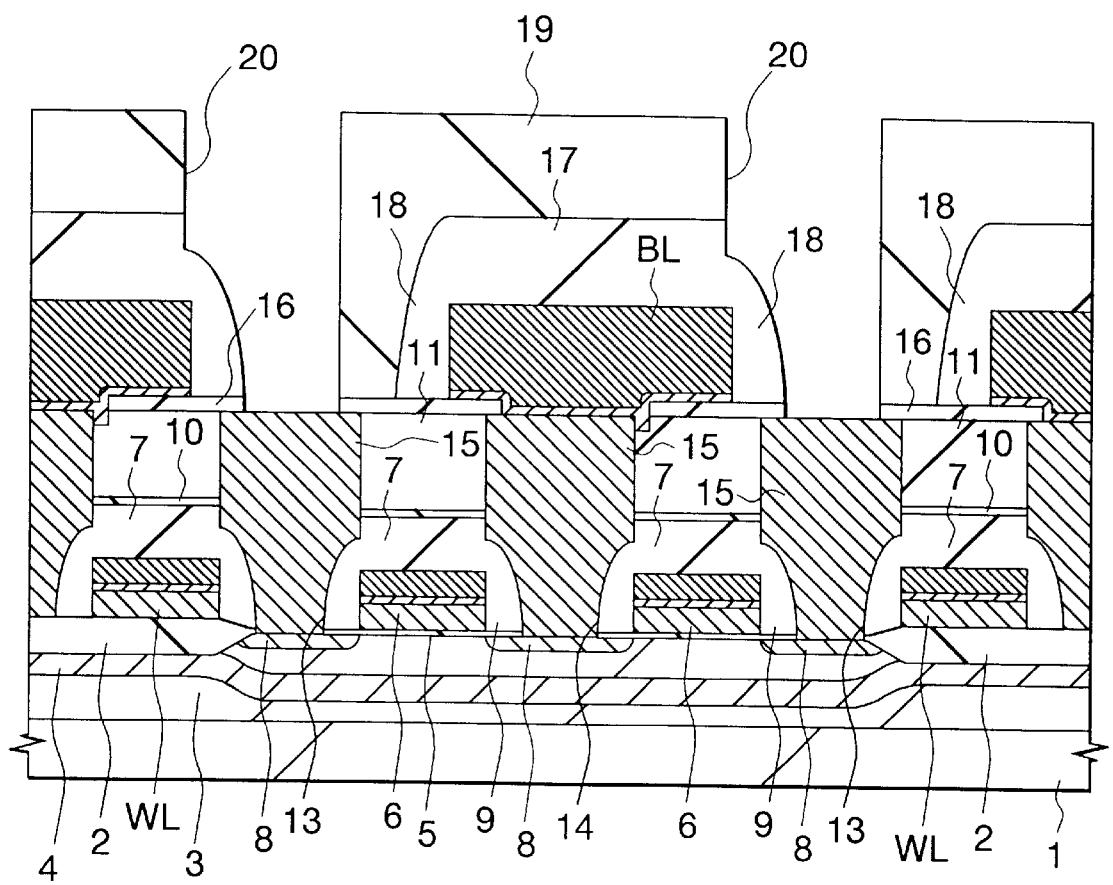
FIG. 12 is a cross-sectional view of the essential part of a semiconductor substrate, which illustrates the process for producing a semiconductor integrated circuit device according to an embodiment of the present invention.

As shown in FIG. 12, a BPSG film 19 of about 300 nm in thickness is then deposited by CVD and reflowed over the bitlines BL, and the BPSG film 19 and the silicon oxide films 16 are then etched using a photoresist as a mask to form connecting holes 20 over the connecting holes 13 formed over the other ones (n-type semiconductor regions 8) of the source and drain regions of the memory cell selection MISFETs Qt. In this etching, the silicon nitride films 17 overlying the bitlines BL and the side wall spacers 18 on the side walls thereof serve as etching stoppers to enable the connecting holes 20 to be formed by self alignment like the connecting holes 13, 14.

Figure 13:
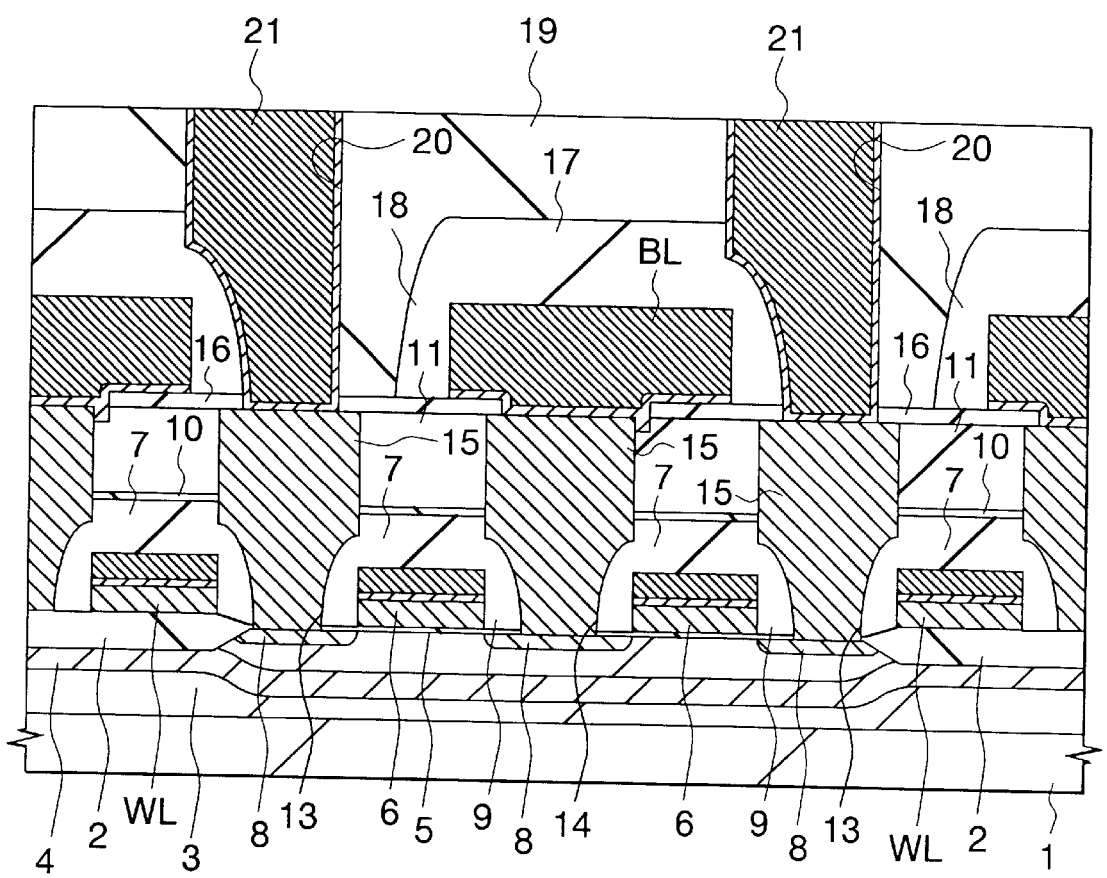
FIG. 13 is a cross-sectional view of the essential part of a semiconductor substrate, which illustrates the process for producing a semiconductor integrated circuit device according to an embodiment of the present invention.
Figure 14:
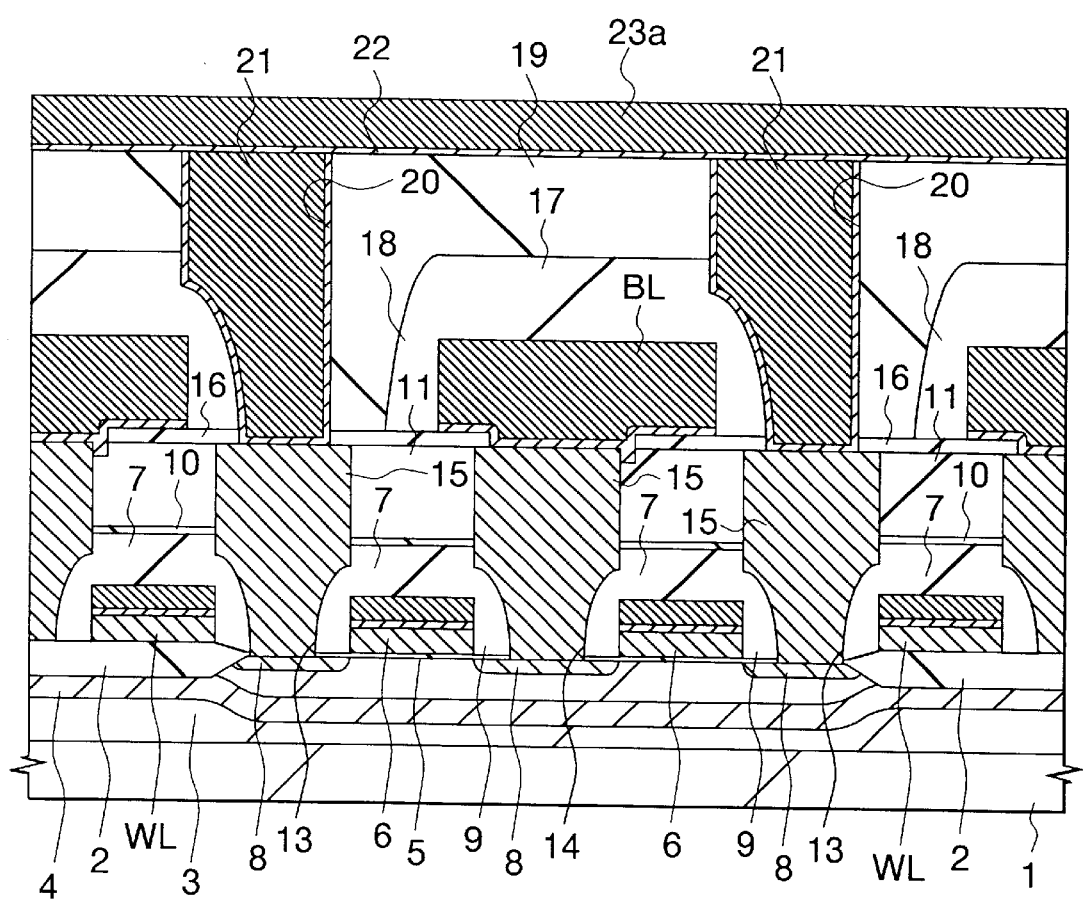
FIG. 14 is a cross-sectional view of the essential part of a semiconductor substrate, which illustrates the process for producing a semiconductor integrated circuit device according to an embodiment of the present invention.

As shown in FIG. 13, plugs 21 are embedded in the connecting holes 20. The plugs 21 are formed according to a procedure comprising depositing a TiN film and a W film over the BPSG films 19, for example, by sputtering, and then etching back these films. The plugs 21 may be formed by embedding polycrystalline silicone, TiN, W, Ti, Ta, etc.

Capacitors are then formed over the plugs 21. In forming the capacitors, a barrier metal 22 is first deposited over the BPSG films 19 by sputtering or the like, and a Pt (platinum) film 23a of about 175 nm in thickness is then deposited over the barrier metal 22. It is to be noted that the barrier metal 22, though not always necessary, is effective in suppressing the diffusion of the lower electrode material (Pt) of the capacitors. TiN, Ti, etc. are usable as the material of the barrier metal 22, the thickness of which may be about 20 nm.

Figure 15:
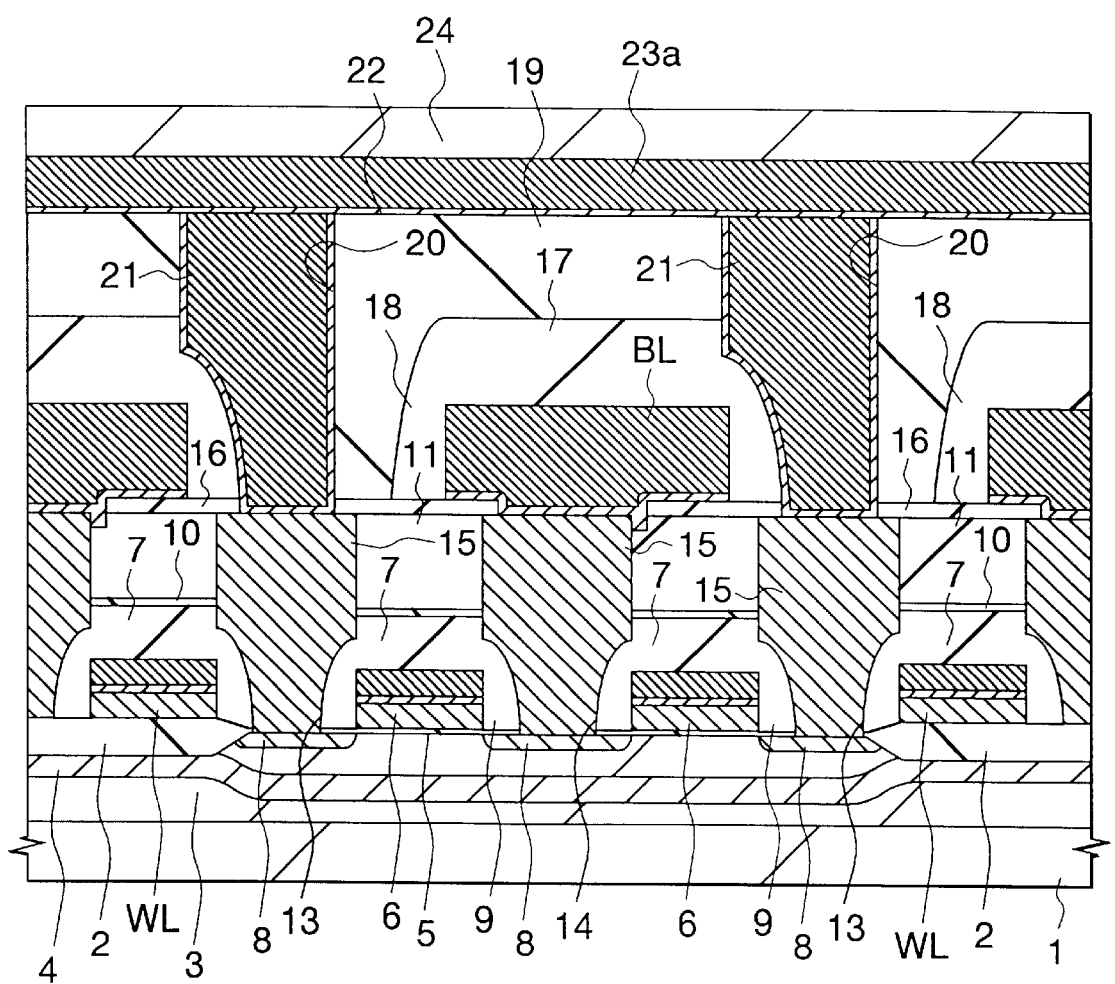
FIG. 15 is a cross-sectional view of the essential part of a semiconductor substrate, which illustrates the process for producing a semiconductor integrated circuit device according to an embodiment of the present invention.

As shown in FIG. 15, a PZT film 24 as one kind of ferroelectric film is then deposited over the Pt film 23a.

Figure 16:
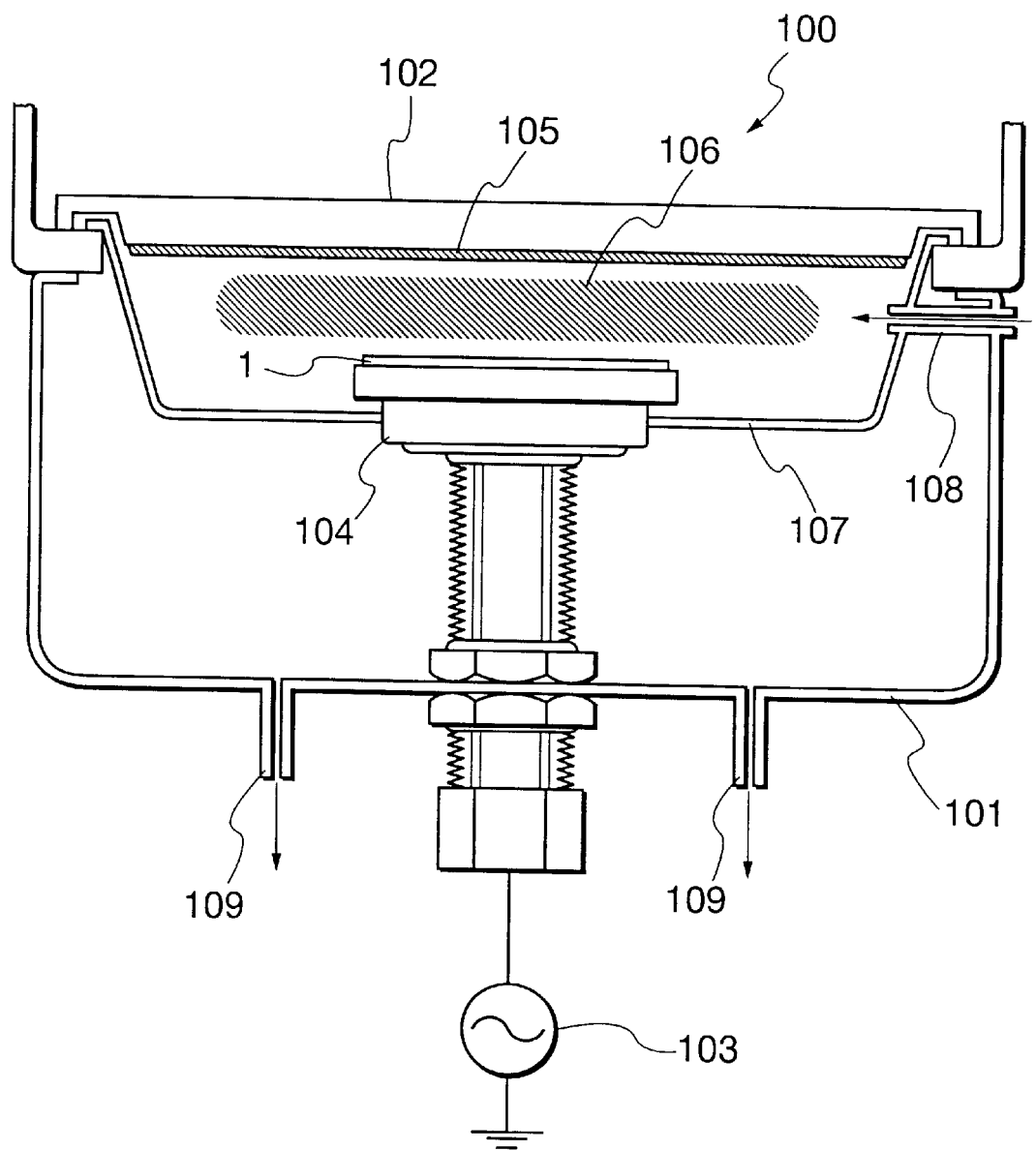
FIG. 16 is a constitutional diagram of the essential part of sputtering equipment for use in the process for producing a semiconductor integrated circuit device according to an embodiment of the present invention.

FIG. 16 is a constitutional diagram of the essential part of the sputtering equipment for use in the deposition of the PZT film 24. A discoid packing plate 102 as a target holding means and a stage 104 connected to an RF power source 103 are disposed facing each other inside a chamber 101 as the treatment chamber of this sputtering equipment 100. A target 105 made of a hot-pressed PZT sinter is attached to the lower surface of the packing plate 102. On the other hand, a semiconductor substrate (wafer) 1 is mounted on the upper surface of the stage 104.

A shield 107 for forming a high-density plasma 106 in a gap between the target 105 and the semiconductor substrate 1 is provided near the stage 104 inside the chamber 101. The wall of the chamber 101 is provided with a gas inlet pipe 108 for feeding an inert gas such as Ar into the chamber 101 and an exhaust pipe 109 for discharging the gas inside the chamber 101.

The conditions of formation of the PZT film 24 are, by way of example, such that the substrate temperature is room temperature, the pressure in the chamber is 5 to 10 mTorr, the Ar flow rate is 10 to 30 sccm, the RF power is 1 kW, and the gap between the target and the substrate is 50 mm, while the thickness of the PZT film 24 thus formed is about 250 nm.

Figure 17:
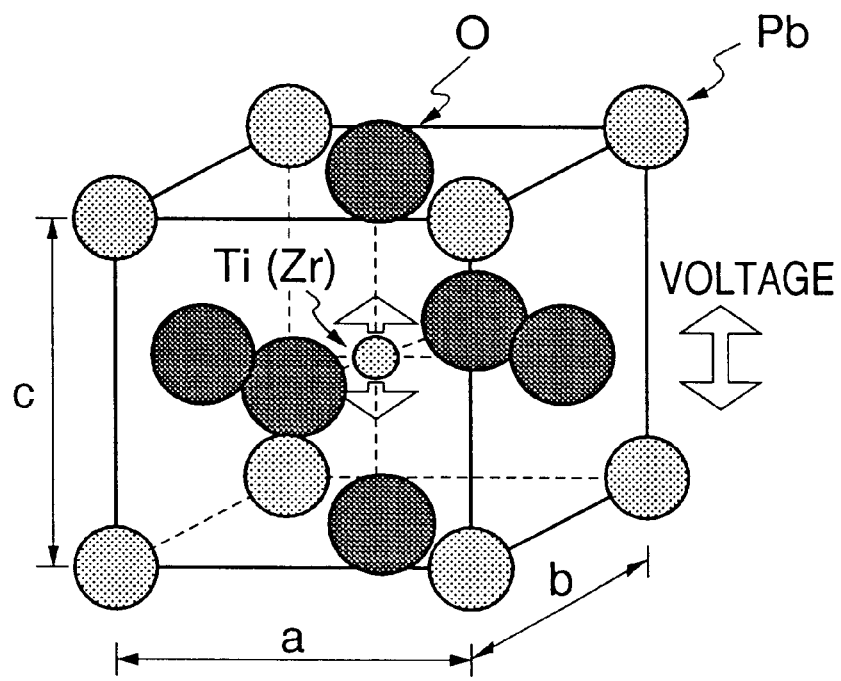
FIG. 17 is a model diagram showing the perovskite crystal structure of PZT.
Figure 17:
Figure 17:
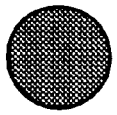
Figure 17:

FIG. 17 is a model diagram showing the perovskite crystal structure of PZT. As shown therein, a unit cell of this perovskite crystal is in the form of an octagon wherein a Ti (or Zr) atom is disposed at the center (B site) thereof, Pb atoms are respectively disposed at the eight vertices (A sites) thereof, and O (oxygen) atoms are respectively disposed at the centers of the eight faces thereof. Polarization occurs by the displacement of the Ti (Zr) disposed at the B site when a predetermined voltage is applied along the direction of the c axis, which is a polarization axis.

Thus, PZT is always liable to undergo an oxygen defect because it takes a perovskite crystal structure including much O (oxygen). Further, the formed film has such a feature that PbO is liable to come off the crystal when the film is treated at a high temperature (at least 850° C.).

The target 105 to be used in this embodiment has a density of at least 90% of the theoretical density of the foregoing perovskite crystal. Herein, the density of the target can be calculated in the following manner:

Specifically, when Na is the Avogadro number, V is the volume of a target, M is the weight of the target, D is the theoretical density of a perovskite crystal (stoichiometric composition), and a, b and c are the respective lengths of the crystallographic axes (a, b and c axes) of the perovskite crystal actually measured by X-ray diffractometry, then the weight of the unit cell, the theoretical density (D) of the perovskite crystal and the density of the target are represented by the following respective formulae because the respective atomic weights and number of atoms, per unit cell, of Pb, O, Ti and Zr as the constituent elements of PZT are such that Pb=207.2 and $(1/8) \times 8 = 1$ for Pb, O=16.00 and $(1/2) \times 6 = 3$ for O, Ti=47.90 and $1 \times 1 \times X = X$ for Ti, and Zr=91.22 and $1 \times 1 \times (1-X) = 1-X$ for Zr:

weight of unit cell=$\{207.2 \times 1 + 16.00 \times 3 + 47.90 \times X + 91.22 \times (1-X)\} \approx Na = Dx\{abc\}$, theoretical density (D)=$\{207.2 \times 1 + 16.00 \times 3 + 47.90 \times X + 91.22 \times (1-X)\} \approx Na \approx \{abc\}$, and density of target (%)=$\{M \approx V\} \approx D \times 100$.

On the other hand, in the case of a crystal structure having a composition departing from the stoichiometric ratio, i.e., a nonstoichiometric composition, such as $Pb_{1.1}Zr_{0.5}Ti_{0.5}O_{3.1}$, the theoretical density is estimated in terms of the density of a stoichiometric composition ($PbZr_{0.5}Ti_{0.5}O_3$) plus that of a constituent $[(PbO)_{0.1}]$ departing from the stoichiometric ratio.

Figures 18, 19:
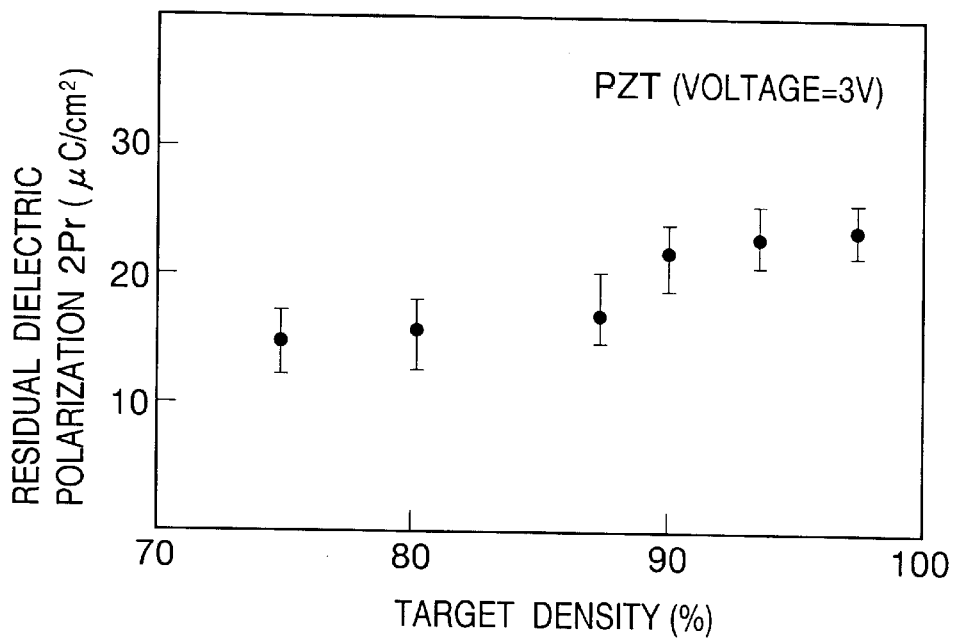
FIG. 18 is a graph showing the relationship between the density of a target and the residual dielectric polarization of a PZT film.
FIG. 19 is a graph showing the hysteresis curves of PZT films.

FIG. 18 is a graph showing the relationship between the density of a target and the residual dielectric polarization of a PZT film, while FIG. 19 is a graph showing the hysteresis curves of PZT films.

As shown in FIG. 18, the PZT films formed using high-density targets each having a density of at least 90% are increased in the value of the residual dielectric polarization (2Pr) as compared with the PZT films formed using low-density targets each having a density lower than 90%, thus being improved in electrical property. On the other hand, as shown in FIG. 19, the PZT film formed using a high-density target is improved in hysteresis characteristics as compared with the PZT film formed using a low-density target, whereby a high value of residual dielectric polarization (2Pr) can be obtained even at a low potential. This is because the use of a high-density target having a density close to the theoretical density (D) of a perovskite crystal enables clusters (fine crystals) close to the perovskite crystal to be formed during sputtering, whereby the structure thereof can be maintained even after film formation.

More specifically, a crystalline target like a PZT target is an aggregate (polycrystalline material) of crystals in itself and is sputtered usually in the form of a cluster of a number of target constituents (unit cells) during sputtering, which deposits as a lump over a substrate. Accordingly, whether the crystallinity of the cluster itself is good or not determines whether the dielectric properties of the film in the process of its formation or as a final product are good or not.

Meanwhile, since the shapes of innumerable grains in a film are determined once the film is annealed after the formation thereof, subsequent annealing in oxygen, even if additionally effected, cannot be expected to secure further crystallization of grains although it may contribute to crystallographic recovery in the grains. In other words, the crystallizability of grains during first annealing after the film formation is important.

Although a description has been made of the case where a PZT target is used, the use of a high-density target having a density exceeding 90% of the theoretical density of a crystal enables a thin film improved in dielectric constant, residual dielectric polarization, hysteresis characteristics, etc. to be obtained even in the case where the capacitive insulating film of a capacitor is formed using a target made of a high-dielectric material such as $Ta_2O_5$ or BST, or a variety of ferroelectric material such as PLT ($PbLa_xTi_{1-x}O_3$), PLZT ($PbLa_yZr_xTi_{1-x}O_3$), SBT ($Sr_xBi_yTaO$), $PbTiO_3$, $SrTiO_3$ or $BaTiO_3$.

Targets produced by the molecular beam epitaxial growth method capable of facilitating the formation of high-quality crystals besides the ordinary hot-pressing (sintering under high-temperature high-pressure sintering) method are suitable as the target to be used in this embodiment of the present invention. It is also possible to apply the plasma sintering method, the explosive sintering method, the laser ablation method, etc.

Figure 20:
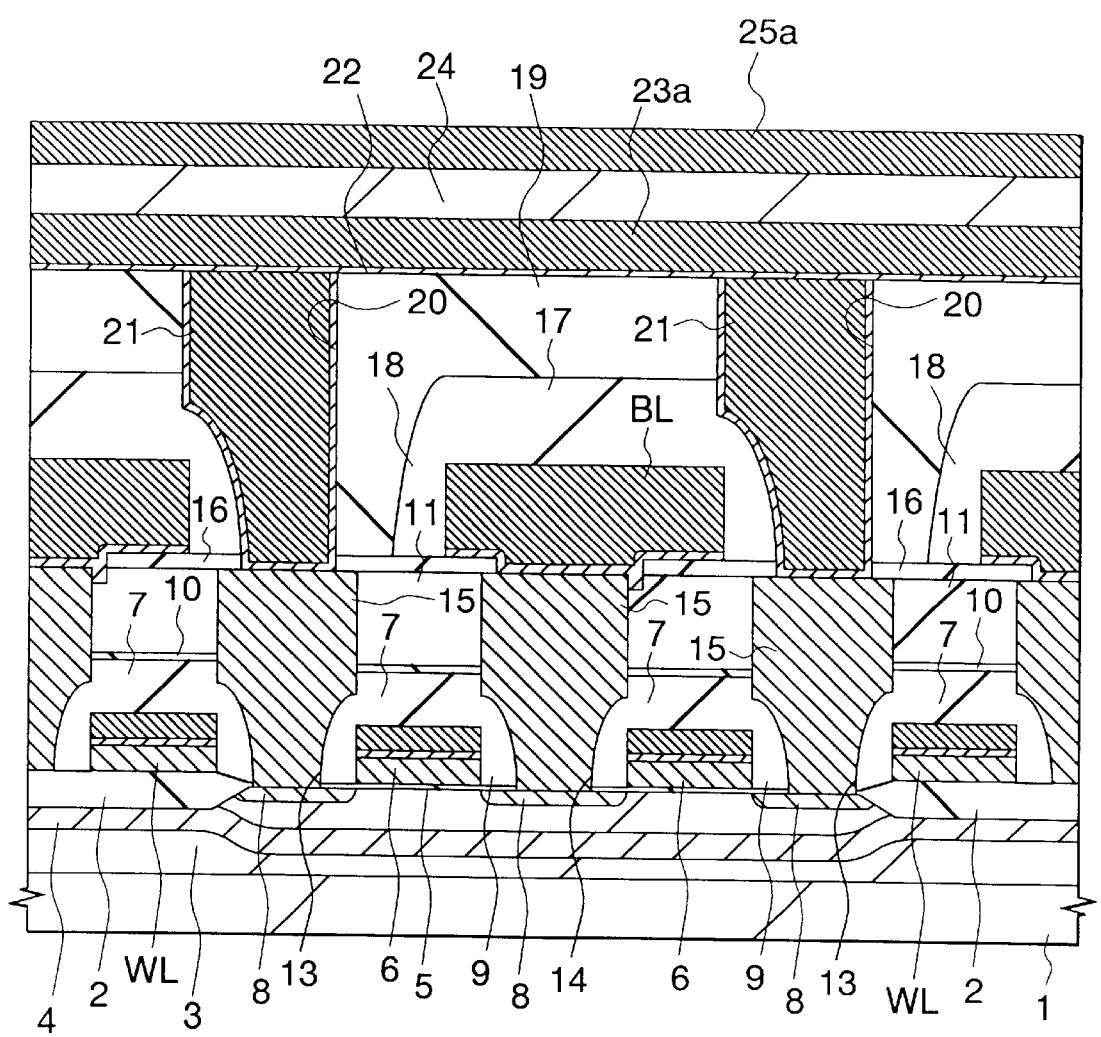
FIG. 20 is a cross-sectional view of the essential part of a semiconductor substrate, which illustrates the process for producing a semiconductor integrated circuit device according to an embodiment of the present invention.
Figure 21:
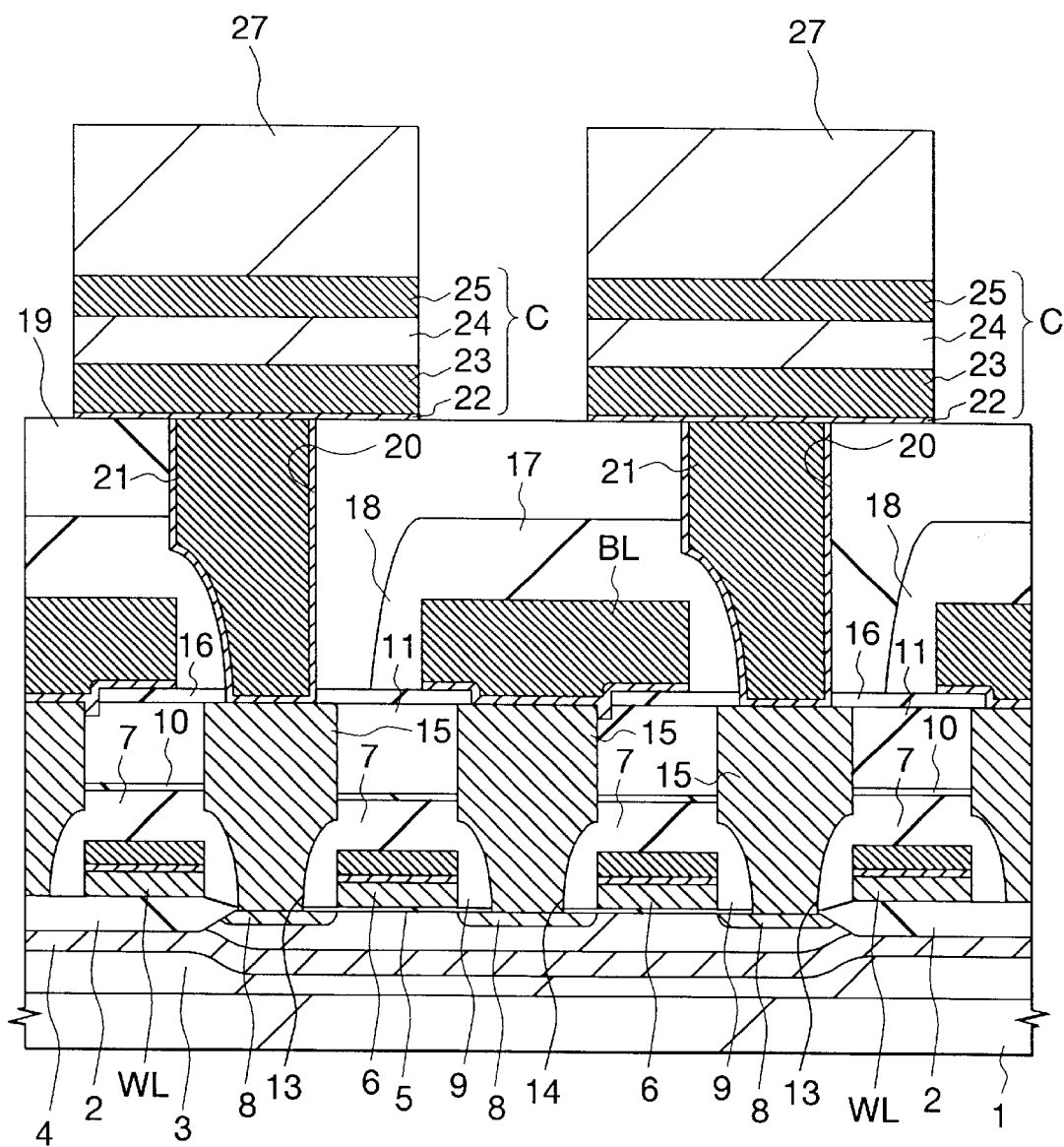
FIG. 21 is a cross-sectional view of the essential part of a semiconductor substrate, which illustrates the process for producing a semiconductor integrated circuit device according to an embodiment of the present invention.

Subsequently, the aforementioned PZT film 24 is annealed in an oxygen atmosphere at 500 to 800° C. to grow fine clusters into crystal grains. Thereafter, a Pt film 25a of about 100 nm in thickness is deposited over the PZT film 24, as shown in FIG. 20. Subsequently, the Pt film 25a, the PZT film 24, the Pt film 23a and the barrier metal 22 are dry-etched using a photoresist formed over the Pt film 25a as a mask to form capacitors C each comprising a barrier metal 22, a lower electrode 23, a PZT film 24 and an upper electrode 25 as shown in FIG. 21.

Also it is possible to use Ir, $IrO_2$, Rh, $RhO_2$, Os, $OsO_2$, Ru, $RuO_2$, Re, $ReO_3$, Pd, Au or a laminated film thereof, in addition to Pt, as the material of the lower electrodes 23 and the upper electrodes 25. In the case of $RuO_2$, $IrO_2$, etc., a thin film having a good coverage can be formed through the deposition thereof by MOCVD. Further, the deposition of Ru, Ir or the like, each having high barrier properties against oxygen, over the above-mentioned thin film can improve the oxidation resistance of the film. If the oxidation in the interfaces of the capacitive insulating films can be suppressed, W, Al, TiN, Ta, Cu, Ag, or a laminated film or the like thereof may alternatively be used as the upper electrode material.

Figure 22:
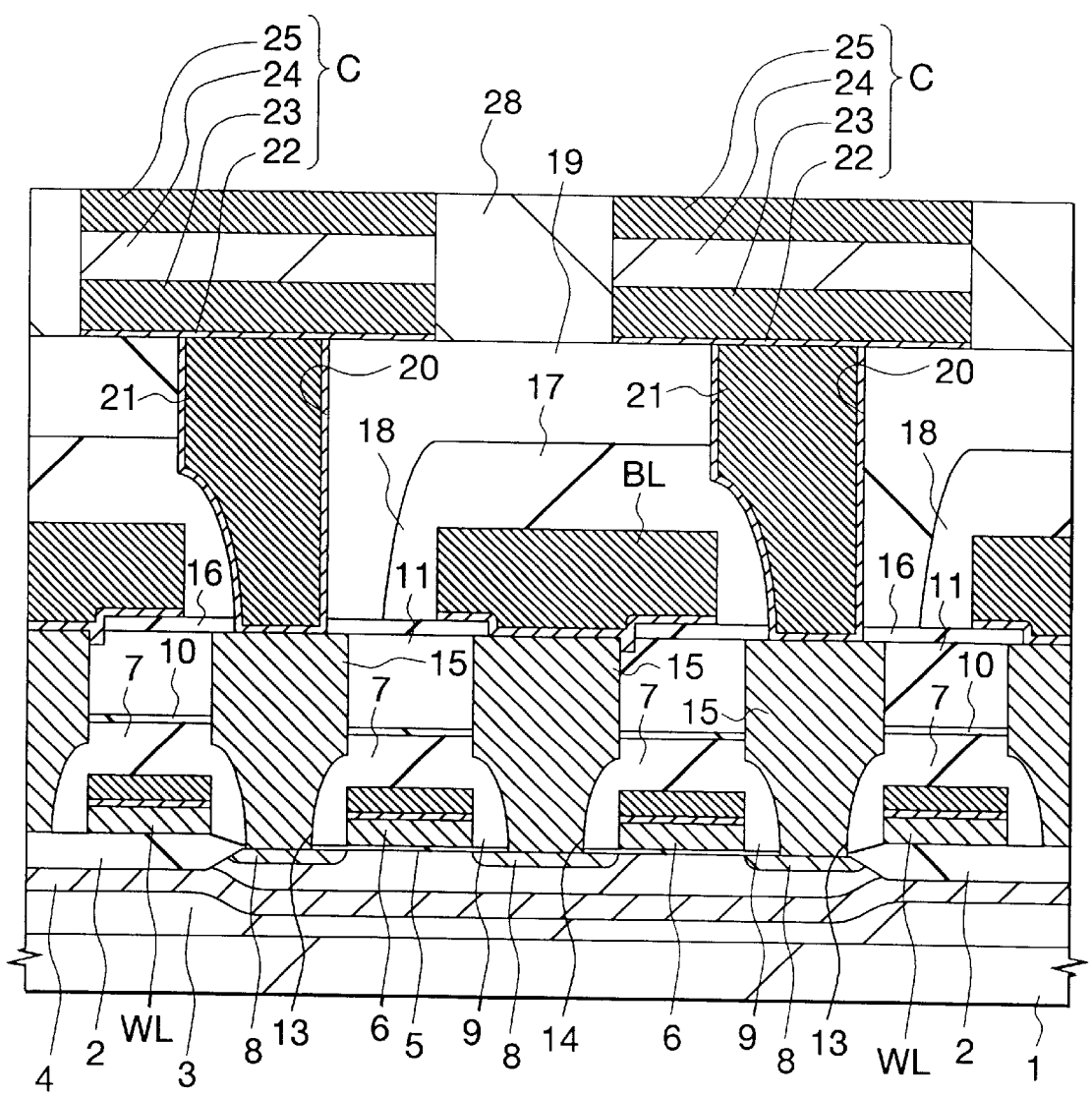
FIG. 22 is a cross-sectional view of the essential part of a semiconductor substrate, which illustrates the process for producing a semiconductor integrated circuit device according to an embodiment of the present invention.

The photoresist 27 over each capacitor C is then removed by ashing. As shown in FIG. 22, a reflowable insulating film 28 such as a BPSG film is then deposited for the protection of the capacitors C, and the surface thereof is then leveled by chemical mechanical polishing (CMP) to expose the surface of each upper electrode 25. In this case, although complete leveling is not indispensable, it is desired that the insulating film 28 be leveled as much as possible in order to enhance the reliability of wirings to be formed over the insulating film 28 in a later step. In order to enhance the effect of protecting the capacitors C, the insulating film 28 may be deposited after the deposition of a thin film made of an oxide of Ti, Sr, Ba or the like, each having a good affinity for the constituent material of the capacitors C. A CVD silicon oxide film formed using an organosilicon compound gas may alternatively be used instead of the reflowable insulating film 28. An organic insulating material such as a polyimide resin may also alternatively be used. The insulating film may be leveled by etching back instead of CMP, and may be dispensed with particularly in the case where a difference in level due to the capacitors is small.

Figure 23:
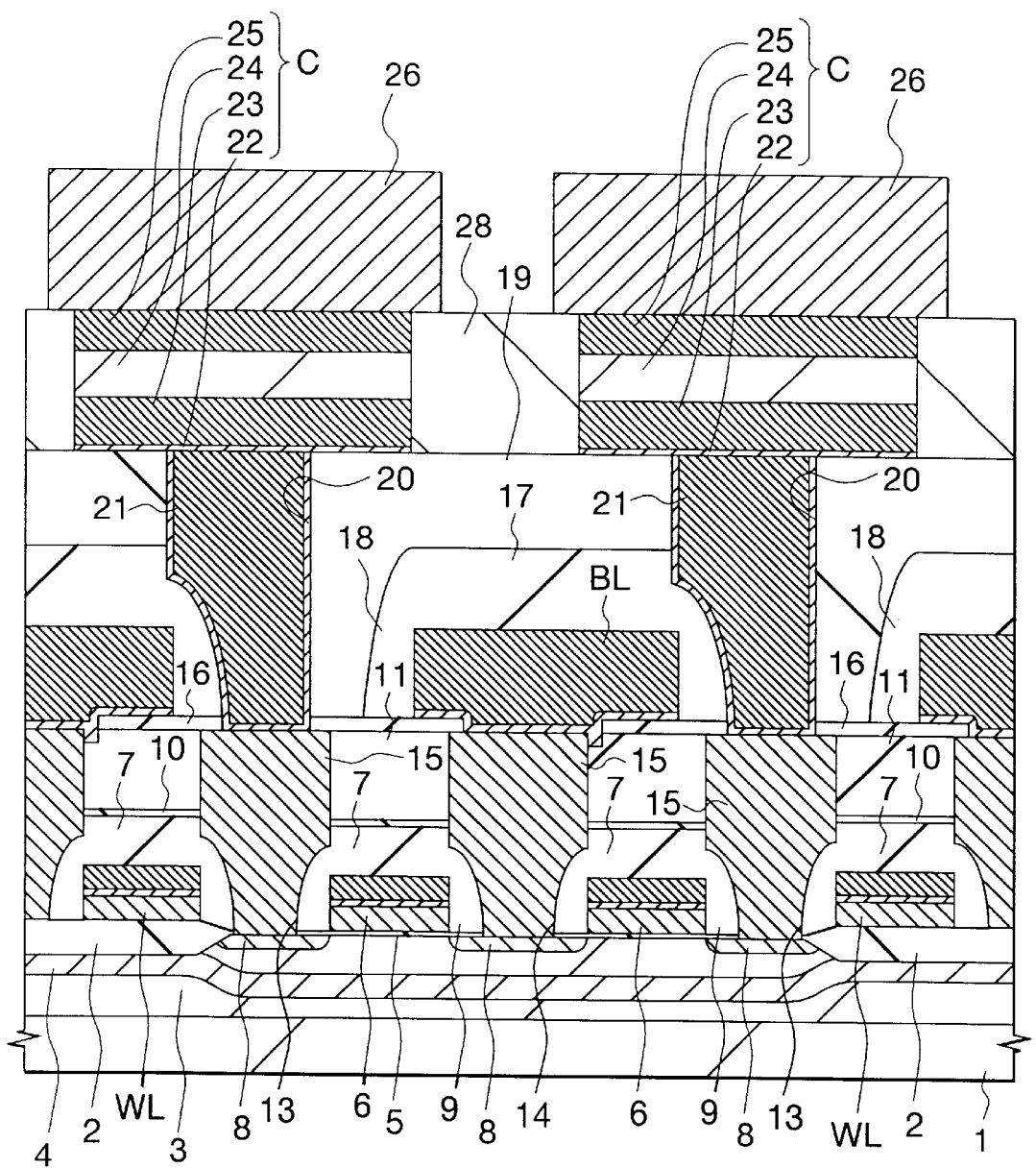
FIG. 23 is a cross-sectional view of the essential part of a semiconductor substrate, which illustrates the process for producing a semiconductor integrated circuit device according to an embodiment of the present invention.

As shown in FIG. 23, plate electrodes 26 each common to a plurality of memory cells are then formed over the insulating film 28. Various conducting materials used in the conventional silicon LSI processes, such as a polycrystalline silicon film, a W film, etc., can be used as the material of the plate electrodes. When the underlying layer has been sufficiently leveled, use is made of a conducting material capable of forming a film by sputtering. On the other hand, when the underlying layer has a difference in level, use is made of a conducting material capable of forming a film by CVD.

According to the foregoing procedure, the formation of memory cells of a DRAM (ferroelectric RAM) in this embodiment is substantially completed. In the case of an actual DRAM (ferroelectric RAM), it goes without saying that about two layers of wirings must further be formed over the plate electrodes 26 to connect the memory cells to peripheral circuits, and that the whole body of the semiconductor substrate 1 must be sealed with a resin package or the like.

Although the invention made by the present inventors has been specifically described based on the embodiment, the present invention is, needless to say, capable of various modifications within the scope of the invention without being limited to the foregoing embodiment.

Although the foregoing embodiment has been described in connection with the case where high-dielectric or ferroelectric thin films are formed as the capacitive insulating films of the capacitors of a DRAM (ferroelectric RAM), the process of the invention can be applied to the production of an MFSFET, an MFSMISFET, etc. wherein ferroelectric thin films are formed as gate insulating films.

Now the effects secured by the representative embodiments of the invention disclosed in the instant application will be briefed.

(1) According to the present invention wherein a target having a density of at least 90% of the theoretical value is used in forming a high-dielectric thin film or a ferroelectric thin film over a substrate by sputtering, it is possible to obtain a high-dielectric or ferroelectric thin film improved in dielectric constant, residual dielectric polarization and hysteresis characteristics.

(2) Since the effect described in the item (1) above serves to increase the amount of electric charge storable in each capacitor of a DRAM, the miniaturization and integration of a DRAM can be promoted.

(3) Since the effect described in the item (1) above serves to improve the resistance to the fatigues of capacitive insulating films through repetition of polarization inversion and suppress a decrease in residual dielectric polarization, the possible number of times of data rewriting in a ferroelectric RAM can be increased. Further, since such an improvement in the fatigue resistance of the capacitive insulating films facilitates the conversion of the 2-transistor/2-capacitor structure of a memory cell of a ferroelectric RAM to a 1-transistor/1-capacitor structure, the miniaturization and integration of a ferroelectric RAM can be promoted.

(4) Since the effect described in the item (1) above serves to decrease the number of times, temperature, and time of annealing effected in an oxygen atmosphere for the recovery of the properties of a high-dielectric or ferroelectric thin film, the deterioration of the properties of the film attributed to annealing can be so suppressed as to improve the reliability and production yield of DRAMs and ferroelectric RAMs.

What is claimed is:

1. A process for producing a semiconductor integrated circuit device, comprising performing sputtering to form a high dielectric film or a ferroelectric film over a substrate, using a target having a density of at least 90% of a theoretical density value, wherein said high-dielectric film or said ferroelectric film substantially has a perovskite crystal structure.

2. A process for producing a semiconductor integrated circuit device as claimed in claim 1, wherein a relative dielectric constant of said high-dielectric film or said ferroelectric film is at least 20.

3. A process for producing a semiconductor integrated circuit device as claimed in claim 2, wherein relative dielectric constant of said high-dielectric film or said ferroelectric thin film is at least 100.

4. A process for producing a semiconductor integrated circuit device as claimed in claim 3, wherein said high-dielectric film or said ferroelectric film is electrically capable of spontaneous polarization inversion.

5. A process for producing a semiconductor integrated circuit device as claimed in claim 1, wherein said high-dielectric film or said ferroelectric film is made of PZT.

6. A process for producing a semiconductor integrated circuit device, comprising the steps of:

(a) installing a target made of a high-dielectric material or a ferroelectric material and having a density of at least 90% of a theoretical value in a target holding portion provided in a treatment chamber of sputtering equipment, and disposing a substrate in such a way that it faces said target, wherein said high-dielectric film or said ferroelectric film substantially has a perovskite crystal structure;

(b) applying an RF bias to said substrate while introducing an inert gas into said treatment chamber reduced in pressure to a predetermined degree of vacuum; and (c) forming a plasma between said target and said substrate and impinging ions of said inert gas formed by a discharge of said plasma against said target to deposit clusters of said high-dielectric material or said ferroelectric material released from the surface of said target over said substrate to thereby form a high-dielectric film or a ferroelectric film over said substrate.

7. A process for producing a semiconductor integrated circuit device, comprising the steps of:

(a) depositing a first conducting film over a principal plane of a wafer for use in the production of a semiconductor integrated circuit device;

(b) depositing a high-dielectric film or a ferroelectric film over said wafer having said first conducting film deposited thereover by sputtering using a target having a density of at least 90% of the theoretical value;

(c) depositing a second conducting film over said wafer having said high-dielectric film or said ferroelectric film deposited thereover; and (d) sequentially etching said second conducting film, said high-dielectric film or said ferroelectric film, and said first conducting film by using a photoresist as a mask to form capacitors.

8. A process for producing a semiconductor integrated circuit device as claimed in claim 7, wherein said high-dielectric film or said ferroelectric film is annealed in an oxygen-containing atmosphere after the deposition thereof.

9. A process for producing a semiconductor integrated circuit device as claimed in claim 8, wherein said high-dielectric film or said ferroelectric film is made of a high-dielectric or ferroelectric material having a perovskite crystal structure and selected from the group consisting of PZT, PLT, PLZT, SBT, $PbTiO_3$, $SrTiO_3$, and $BaTiO_3$.

10. A process for producing a semiconductor integrated circuit device as claimed in claim 9, wherein said first and second conducting films are made of at least one metal or metal oxide thereof selected from the group consisting of Pt, Ir, $IrO_2$, Rh, $RhO_2$, Os, $OsO_2$, Ru, $RuO_2$, Re, $ReO_3$, Pd, and Au.

11. A process for producing a semiconductor integrated circuit device as claimed in claim 10, wherein said capacitors are each a capacitor of a memory cell of a DRAM.

12. A process for producing a semiconductor integrated circuit device as claimed in claim 10, wherein said capacitors are each a capacitor of a memory cell of a ferroelectric RAM.

13. A process for producing a semiconductor integrated circuit device as claimed in claim 12, wherein said memory cell of said ferroelectric RAM comprises one MISFET and one of said capacitors.

14. A process for producing a semiconductor integrated circuit device as claimed in claim 10, wherein said high-dielectric film or said ferroelectric film is made of PZT.

15. A process for producing a semiconductor integrated circuit device as claimed in claim 9, wherein said high-dielectric film or said ferroelectric film is made of PZT.

16. A process for producing a semiconductor integrated circuit device, comprising the steps of:
  (a) preparing a wafer for use in the production of a semiconductor integrated circuit device, wherein a part or the whole of each of a plurality of semiconductor elements is formed on the first principal plane side of said wafer; and
  (b) forming a high-dielectric film or a ferroelectric film, which constitutes a dielectric film for information storage in a volatile or nonvolatile memory, over the first principal plane of said wafer either directly or with one or more intermediate films therebetween by sputtering using a target having a density of as high as at least 90% of the theoretical density at least in the portion thereof subject to sputtering.

17. A process for producing a semiconductor integrated circuit device, comprising the steps of:
  (a) preparing a wafer for use in the production of a semiconductor integrated circuit device, wherein a part or the whole of each of a plurality of semiconductor elements is formed on the first principal plane side of said wafer;
  (b) forming a conducting film, which constitutes a lower electrode of a capacitive element for information storage in a volatile or nonvolatile memory, over the first principal plane of said wafer either directly or with one or more intermediate films therebetween;
  (c) forming a high-dielectric or ferroelectric film, which constitutes a dielectric film of a capacitive element for information storage in a volatile or nonvolatile memory, over the first principal plane of said wafer having a layer of said lower electrode formed thereover either directly or with one or more intermediate films therebetween by sputtering using a target having a density of as high as at least 90% of the theoretical density at least in the portion thereof subject to sputtering; and
  (d) forming a conducting film, which constitutes an upper electrode of a capacitive element for information storage in a volatile or nonvolatile memory, over the first principal plane of said wafer having said dielectric film formed thereover either directly or with one or more intermediate films therebetween.

18. A process for producing a semiconductor integrated circuit device as claimed in claim 17, wherein said dielectric film for information storage has a relative dielectric constant of at least 20 in the final product.

19. A process for producing a semiconductor integrated circuit device as claimed in claim 18, wherein said dielectric film for information storage substantially has a perovskite structure.

20. A process for producing a semiconductor integrated circuit device, comprising the steps of:
  (a) preparing a wafer for use in the production of a semiconductor integrated circuit device, wherein a part or the whole of each of a plurality of semiconductor elements is formed on the first principal plane side of said wafer;
  (b) leveling the first principal plane of said wafer having said plurality of semiconductor elements formed thereover by chemical mechanical polishing; and
  (c) forming a high-dielectric or ferroelectric film, which constitutes a dielectric film for information storage in a volatile or nonvolatile memory, over the leveled first principal plane of said wafer either directly or with one or more intermediate films therebetween by sputtering using a target having a density of as high as at least 90% of the theoretical density at least in the portion thereof subject to sputtering.

21. A process for producing a semiconductor integrated circuit device as claimed in claim 20, wherein said dielectric film for information storage has a relative dielectric constant of at least 20 in the final product.

22. A process for producing a semiconductor integrated circuit device as claimed in claim 21, wherein said dielectric film for information storage substantially has a perovskite structure.

23. A process for producing a semiconductor integrated circuit device, comprising the steps of:
  (a) preparing a wafer for use in the production of a semiconductor integrated circuit device, wherein a part or the whole of each of a plurality of semiconductor elements is formed on the principal plane side of said wafer;
  (b) leveling the first principal plane of said wafer having said plurality of semiconductor elements formed thereover by chemical mechanical polishing;
  (c) forming a conducting film, which constitutes a lower electrode of a capacitive element for information storage in a volatile or nonvolatile memory, over the leveled first principal plane of said wafer either directly or with one or more intermediate films therebetween;
  (d) forming a high-dielectric or ferroelectric film, which constitutes a dielectric film of a capacitive element for information storage in a volatile or nonvolatile memory, over the first principal plane of said wafer having a layer of said lower electrode formed thereover either directly or with one or more intermediate films therebetween by sputtering using a target having a density of as high as at least 90% of the theoretical density at least in the portion thereof subject to sputtering; and
  (e) forming a conducting film, which constitutes an upper electrode of a capacitive element for information storage in a volatile or nonvolatile memory, over the first principal plane of said wafer having said dielectric film formed thereover either directly or with one or more intermediate films therebetween.

24. A process for producing a semiconductor integrated circuit device as claimed in claim 23, wherein said dielectric film for information storage has a relative dielectric constant of at least 20 in the final product.

25. A process for producing a semiconductor integrated circuit device as claimed in claim 24, wherein said dielectric film for information storage substantially has a perovskite structure.

26. A process for producing a semiconductor integrated circuit device as claimed in claim 25, wherein said dielectric film for information storage is made of PZT.

27. A process for producing a semiconductor integrated circuit device as claimed in claim 23, wherein said target is made of PZT.

28. A process for producing a semiconductor integrated circuit device, comprising the steps of:
   (a) emitting sputtered particles by colliding inert gas ions under a vacuum condition with a first surface of a high-dielectric or ferroelectric sputtering target having a first chemical composition and having a density of said first chemical composition which is no less than 90% of a theoretical density thereof;
   (b) forming a high-dielectric or ferroelectric film by depositing the sputtered particles under the vacuum condition over a lower electrode overlying a first major surface of a semiconductor wafer, said high-dielectric or ferroelectric film having a second chemical composition substantially the same as the first chemical composition; and
   c) after step (b), improving crystalline characteristics of the high-dielectric or ferroelectric film by performing an annealing treatment thereto in a gas ambient including an oxygen gas.

29. A process for producing a semiconductor integrated circuit device according to claim 28, wherein the high-dielectric or ferroelectric film and the lower electrode constitute a memory capacitor of a memory cell.

30. A process for producing a semiconductor integrated circuit device according to claim 29, wherein the first chemical composition, of the target, is shifted from a stoichiometric composition.

31. A process for producing a semiconductor integrated circuit device according to claim 30, further comprising the step of:
   (d) prior to step (a), planarizing the first major surface of the semiconductor wafer by a treatment including chemical mechanical polishing.

32. A process for producing a semiconductor integrated circuit device, comprising the steps of:
   (a) emitting sputtered particles by colliding inert gas ions under a vacuum condition with a first surface of a high-dielectric or ferroelectric sputtering target, which is made of a double oxide and has a density no less than 90% of its theoretical density; and
   (b) forming a high-dielectric or ferroelectric film by depositing the sputtered particles under the vacuum condition over a lower electrode overlying a first major surface of a semiconductor wafer.

33. A process for producing a semiconductor integrated circuit device, comprising the steps of:
   (a) emitting sputtered particles by colliding inert gas ions under a vacuum condition with a first surface of a high-dielectric or ferroelectric sputtering target having a density no less than 90% of its theoretical density, a relative dielectric constant of said target being no less than 100; and
   (b) forming a high-dielectric or ferroelectric film by depositing the sputtered particles under the vacuum condition over a lower electrode overlying a first major surface of a semiconductor wafer.

34. A process for producing a semiconductor integrated circuit device according to claim 33, wherein the high-dielectric or ferroelectric film is made of BST, PZT, PLT, PLZT, SBT, $PbTiO_3$, $SrTiO_3$, or $BaTiO_3$.

35. A process for producing a semiconductor integrated circuit device, comprising the steps of:
   (a) emitting sputtered particles by colliding inert gas ions under a vacuum condition with a first surface of a high-dielectric or ferroelectric sputtering target having a density no less than 90% of its theoretical density, the crystalline structure of said target including a perovskite structure; and
   (b) forming a high-dielectric or ferroelectric film by depositing the sputtered particles under the vacuum condition over a lower electrode overlying a first major surface of a semiconductor wafer.

36. A process for producing a semiconductor integrated circuit device according to claim 35, wherein the high-dielectric or ferroelectric film is made of BST, PZT, PLT, PLZT, SBT, $PbTiO_3$, $SrTiO_3$, or $BaTiO_3$.

37. A process for producing a semiconductor integrated circuit device, comprising the steps of:
   (a) emitting sputtered particles by colliding inert gas ions under a vacuum condition with a first surface of a high-dielectric or ferroelectric sputtering target having a density no less than 90% of its theoretical density; and
   (b) forming a high-dielectric or ferroelectric film by depositing the sputtered particles under the vacuum condition over a lower electrode overlying a first major surface of a semiconductor wafer.

38. A process for producing a semiconductor integrated circuit device according to claim 37, wherein the ferroelectric film and the lower electrode constitute a memory capacitor of a nonvolatile memory cell.

39. A process for producing a semiconductor integrated circuit device, comprising the steps of:
   (a) emitting sputtered particles by colliding inert gas ions under a vacuum condition with a first surface of a high-dielectric or ferroelectric sputtering target having a density no less than 90% of its theoretical density, a crystalline structure of said target being a perovskite structure including Pb; and
   (b) forming a high-dielectric or ferroelectric film by depositing the sputtered particles under the vacuum condition over a lower electrode overlying a first major surface of a semiconductor wafer.

40. A process for producing a semiconductor integrated circuit device according to claim 39, wherein the high-dielectric or ferroelectric film and the lower electrode constitute a memory capacitor of a nonvolatile memory cell.

41. A process for producing a semiconductor integrated circuit device, comprising the steps of:
   (a) emitting sputtered particles by colliding inert gas ions under a vacuum condition with a first surface of a high-dielectric or ferroelectric sputtering target having a first chemical composition and having a density of said first chemical composition which is no less than 90% of its theoretical density thereof, at the portion of the first surface of the target to be sputtered; and (b) forming a high-dielectric or ferroelectric film by depositing the sputtered particles under the vacuum condition over a lower electrode overlying a first major surface of a semiconductor wafer, said high-dielectric or ferroelectric film having a second chemical composition substantially the same as the first chemical composition.

42. A process for producing a semiconductor integrated circuit device, comprising the steps of:

(a) emitting sputtered particles by colliding inert gas ions under a vacuum condition with a first surface of a high-dielectric or ferroelectric sputtering target, which is made of a double oxide and has a density no less than 90% of its theoretical density at a portion of the first surface of the target to be sputtered; and (b) forming a high-dielectric or ferroelectric film by depositing the sputtered particles under the vacuum condition over a lower electrode overlying a first major surface of a semiconductor wafer.

43. A process for producing a semiconductor integrated circuit device according to claim 42, further comprising the steps of:

(c) after step (b), improving crystalline characteristics of the high-dielectric or ferroelectric film by performing an annealing treatment thereto in a gas ambient including an oxygen gas.

44. A process for producing a semiconductor integrated circuit device according to claim 43, further comprising the step of:

(d) prior to step (a), planarizing the first major surface of the semiconductor wafer by a treatment including chemical mechanical polishing.

45. A process for producing a semiconductor integrated circuit device according to claim 44, wherein the high-dielectric or ferroelectric film and the lower electrode constitute a memory capacitor of a memory cell.

46. A process for producing a semiconductor integrated circuit device according to claim 45, wherein the lower electrode includes at least one material selected from the group consisting of platinum, ruthenium, and iridium, and oxides thereof.

47. A process for producing a semiconductor integrated circuit device according to claim 45, wherein the lower electrode includes at least one material selected from the group consisting of platinum, ruthenium, rhodium, osmium, rhenium, palladium, gold and iridium, and oxides thereof.

48. A process for producing a semiconductor integrated circuit device, comprising the steps of:

(a) emitting sputtered particles by colliding inert gas ions under a vacuum condition with a first surface of a high-dielectric or ferroelectric sputtering target having a density no less than 90% of its theoretical density at a portion of the first surface of the target to be sputtered, a relative dielectric constant of said target being no less than 100; and (b) forming a high-dielectric or ferroelectric film by depositing the sputtered particles under the vacuum condition over a lower electrode overlying a first major surface of a semiconductor wafer.

49. A process for producing a semiconductor integrated circuit device, comprising the steps of:

(a) emitting sputtered particles by colliding inert gas ions under a vacuum condition with a first surface of a high-dielectric or ferroelectric sputtering target having a density no less than 90% of its theoretical density at a portion of the first surface of the target to be sputtered, a crystalline structure of said target including a perovskite structure; and (b) forming a high-dielectric or ferroelectric film by depositing the sputtered particles under the vacuum condition over a lower electrode overlying a first major surface of a semiconductor wafer.

50. A process for producing a semiconductor integrated circuit device, comprising the steps of:

(a) emitting sputtered particles by colliding inert gas ions under a vacuum condition with a first surface of a high-dielectric or ferroelectric sputtering target having a density no less than 90% of its theoretical density at a portion of the first surface of the target to be sputtered; and (b) forming a high-dielectric or ferroelectric film by depositing the sputtered particles under the vacuum condition over a lower electrode overlying a first major surface of a semiconductor wafer.

51. A process for producing a semiconductor integrated circuit device, comprising the steps of:

(a) emitting sputtered particles by colliding inert gas ions under a vacuum condition with a first surface of a high-dielectric or ferroelectric sputtering target having a density no less than 90% of its theoretical density at a portion of the first surface of the target to be sputtered, a crystalline structure of said target being a perovskite structure including Pb; and (b) forming a high-dielectric or ferroelectric film by depositing the sputtered particles under the vacuum condition over a lower electrode overlying a first major surface of a semiconductor wafer.

52. A process for producing a semiconductor integrated circuit device, comprising performing sputtering to form a high dielectric film or a ferroelectric film over a substrate, using a target having a density of at least 90% of a theoretical density value, wherein said high-dielectric film or said ferroelectric film is made of PZT.

53. A process for producing a semiconductor integrated circuit device, comprising performing sputtering to form a high dielectric film or a ferroelectric film over a substrate, using a target having a density of at least 90% of a theoretical density value, wherein said target is made of PZT.

54. A process for producing a semiconductor integrated circuit device, comprising the steps of:

(a) preparing a wafer for use in the production of a semiconductor integrated circuit device, wherein a part or the whole of each of a plurality of semiconductor elements is formed on the first principal plane side of said wafer; and (b) forming a high-dielectric film or a ferroelectric film, which constitutes a dielectric film for information storage in a volatile or nonvolatile memory, over the first principal plane of said wafer either directly or with one or more intermediate films therebetween by sputtering using a target having a density of as high as at least 90% of the theoretical density at least in the portion thereof subject to sputtering, wherein said dielectric film for information storage has a relative dielectric constant of at least 20 in the final product.

55. A process for producing a semiconductor integrated circuit device as claimed in claim 54, wherein said dielectric film for information storage substantially has a perovskite structure.

* * * * *